United States Patent

Kohno et al.

[11] Patent Number: 5,854,569
[45] Date of Patent: Dec. 29, 1998

[54] CURRENT SOURCE FOR RAPID SWITCHING AND REDUCED OSCILLATORY TRANSIENTS

[75] Inventors: Hiroyuki Kohno; Yasuyuki Nakamura; Takahiro Miki, all of Itami, Japan

[73] Assignee: Mitsubishi Denki Kabushiki Kaisha, Tokyo, Japan

[21] Appl. No.: 890,027

[22] Filed: Jul. 31, 1997

Related U.S. Application Data

[63] Continuation of Ser. No. 496,306, Jun. 29, 1995, abandoned.

[30] Foreign Application Priority Data

Nov. 15, 1994 [JP] Japan ........................ 6-280375

[51] Int. Cl.[6] .................................................. G05F 3/02
[52] U.S. Cl. .................... 327/543; 327/534; 327/538; 327/434; 327/436; 327/437
[58] Field of Search .......................... 327/534, 537, 327/538, 541, 543, 545, 546, 427, 434, 437, 52, 65, 408; 326/115

[56] References Cited

U.S. PATENT DOCUMENTS

| | | | |
|---|---|---|---|
| 4,590,456 | 5/1986 | Burton et al. | 327/436 |
| 4,611,130 | 9/1986 | Swanson | 327/65 |
| 4,728,825 | 3/1988 | Sugayama et al. | 327/434 |
| 4,868,419 | 9/1989 | Austin | 327/436 |
| 4,885,477 | 12/1989 | Bird et al. | 327/52 |
| 4,937,517 | 6/1990 | Kurashima | 327/541 |
| 5,420,529 | 5/1995 | Guay et al. | 326/115 |
| 5,461,585 | 10/1995 | Chonan | 327/534 |
| 5,534,795 | 7/1996 | Wert et al. | 327/534 |
| 5,726,592 | 5/1998 | Schulte et al. | 327/65 |

FOREIGN PATENT DOCUMENTS

| | | | |
|---|---|---|---|
| 58-43624 | 3/1983 | Japan | 327/543 |
| 61-101121 | 5/1996 | Japan | 327/436 |

OTHER PUBLICATIONS

Waters et al., IBM Technical Disclosure Bulletin — "High–voltage FET Driver", Apr. 1973, pp. 3449 3450.

Handbook on Noise & EMI Reduction, "Advanced Technique in Noise Countermeasures", Chapter VI 3.1, Wiring Method, pp. 198–199 (with English Abstract).

IEEE 1991 Custom Integrated Circuits Conference, pp. 26.5.1–26.5.4, 1991, Hiroshi Takakura, et al., "A 10 Bit 80 MHz Glitchless CMOS D/A Converter".

ISSCC Digest Technical Paper, pp. 134–135, Feb. 20, 1986, Kuang K. Chi, et al., "A 100mb/s CMOS Video D/A Converter with Shift Register and Color Map".

Primary Examiner—Terry D. Cunningham
Attorney, Agent, or Firm—Oblon, Spivak, McClelland, Maier & Neustadt, P.C.

[57] ABSTRACT

A current source and a semiconductor integrated circuit device for suppressing fluctuations occured in an output current of current sources composed MOS transistors for switching. A back gate voltage of MOS transistors M1, M3 for switching connected in series to a constant current generator 9 is supplied through a power source line 5d independent of a power source line 4d which supplies a driving voltage. The stabilization of the back gate voltage leads the operation of the MOS transistors M1, M3 to be stabilized, thereby suppressing the fluctuations occured in the output currents $I_{out}$ and $\overline{I}_{out}$ current sources.

4 Claims, 27 Drawing Sheets

5,854,569

CURRENT SOURCE FOR RAPID SWITCHING AND REDUCED OSCILLATORY TRANSIENTS

This application is a continuation of application Ser. No. 08/496,306, filed on Jun. 29, 1995, now abandoned.

BACKGROUND OF THE INVENTION

1. Field of the Invention

The present invention relates to a current source having a switching function to be used in D/A converter or the like, and more particularly to a current source capable of obtaining a current output with a small oscillatory transient (ringing) even by performing a rapid switching (for example, hundreds of millions of cycles in a second or more).

2. Description of the Background Art

A D/A converter for converting digital signals into analog signals is an indispensable electronic appliance in the fields of measurement, control, communication, video and other consumer electronic appliances. Examples of circuit configuration of D/A converter are disclosed, for example, by Kuang K. Chi et al. in "A 100 Mb/s CMOS Video D/A Converter with Shift Register and Color Map," ISSCC Digest Technical Paper, 1986, pp. 134–135, or Hiroshi T. et al. in "A 10 bit 80 MHz Glitchless CMOS D/A Converter," CICC, 1991, pp. 26.5.1–26.5.4, among others, and in the D/A converters of various types unveiled in these publications, it is known that current sources responsible for switching are used widely. Thus, in the constitution of D/A converters, the current source responsible for switching is a very important circuit.

Circuit examples of conventional current sources are explained by reference to FIG. 22 and FIG. 23. FIG. 22 and FIG. 23 are circuit diagrams showing the constitution of current sources composed individually of NMOS transistors and PMOS transistors.

In FIG. 22, reference numerals M20 and M21 are NMOS transistors for switching having the sources connected commonly (hereinafter called common source), and 101 is a constant current generator provided between the common source of the NMOS transistors M20, M21, and a power supply line 4d for feeding a grounding voltage $V_{SS}$ for passing a specific current $I_{SS}$.

The drains of the NMOS transistors M20, M21 are connected to current output terminals 102, 103, respectively. The gates of the NMOS transistors M20, M21 are connected to input terminals 104, 105, respectively, to which control signals $V_G$ and $\overline{V_G}$ are fed, respectively. The control signals $V_G$ and $\overline{V_G}$ are complementary signals for alternately turning on and off the NMOS transistors M20, M21.

In FIG. 23, reference numerals M25 and M26 are PMOS transistors for switching having the sources connected commonly, and 111 is a constant current generator provided between the common source of the PMOS transistors M25, M26, and a power supply line 4c for feeding a supply voltage $V_{DD}$ for passing a specific current $I_{SS}$.

The drains of the PMOS transistors M25, M26 are connected to current output terminals 112, 113, respectively. The gates of the PMOS transistors M25, M26 are connected to input terminals 114, 115, respectively, to which control signals $V_G$ and $\overline{V_G}$ are fed, respectively. The control signals $V_G$ and $\overline{V_G}$ are complementary signals for alternately turning on and off the PMOS transistors M25, M26.

The operation of the current source used for switching of conventional NMOS transistors is described below while referring to FIG. 24. When the input terminal 104 is at a low level and input terminal 105 is at a high level, the NMOS transistor M20 is OFF and the NMOS transistor M21 is ON, and therefore the value of an output current $\overline{I_{out}}$ flowing from the current output terminal 103 is $I_{SS}$ as shown in FIG. 24, while the value of an output current $I_{out}$ from the current output terminal 102 is 0. To the contrary, when the input terminal 104 is at a high level and the input terminal 105 is at a low level, the NMOS transistor M20 is ON and the NMOS transistor M21 is OFF, so that the value of the output current $I_{out}$ is $I_{out}$ is $I_{SS}$, while the value of the output current $\overline{I_{out}}$ is 0. Incidentally, when the difference of the control signal $V_G$ and $\overline{V_G}$ is 0, an equal current flows in the NMOS transistors M20, M21. Therefore, the value of both output current $I_{out}$ and $\overline{I_{out}}$ is $I_{SS}/2$.

For example, in the D/A converter, when using the current source performing such switching operation as mentioned above, a plurality of current sources are prepared depending on the number of bits of digital input, and each of the current sources is operated corresponding to the digital input. Accordingly, for example, by passing all of the output currents $I_{out}$ of operating current sources into one resistance, an analog voltage corresponding to the digital input signal is obtained.

The actual state of use of the conventional current source is described in FIG. 25 through FIG. 27. FIG. 25 is a schematic diagram of a semiconductor integrated circuit device mounting a semiconductor integrated circuit chip in which current sources are formed. In FIG. 25, reference numeral 120 denotes a chip forming a semiconductor integrated circuit including current sources, 121 is part of a package for protecting the chip 120, 122 is a pad formed on the chip for electrically connecting the chip and the wiring on the package, 123 is a wiring pattern disposed on the package 121, 124 is a wire for connecting the pad 122 on the chip 120 and the wiring pattern 123, 125 is a pin for electrically connecting between the wiring pattern 123 and an outside circuit, and 126 is a power source connected to a terminal on a board on which the package is mounted.

FIG. 26 and FIG. 27 are circuit diagrams showing the current source state included in the mounted semiconductor integrated circuit device. Examples of composing a constant current generator in one MOS transistor are shown in FIG. 27 and FIG. 27. In FIG 26, reference numeral 130 denotes a power source line formed in the chip, 131 is an inductance parasitizing the power source wiring for supplying electric power from outside the package into the chip 121 in the package, M22 is an NMOS transistor having a gate to which a reference voltage Bias is applied, a source connected to the power source line 130, and a drain connected to the common source of the NMOS transistors M20, M21 for composing a constant current generator, and the other elements with the same reference numbers as in FIG. 22 represent the corresponding parts in FIG. 22.

In FIG. 27, reference numeral 135 is a power source line formed in the chip, 136 is an inductance parasitizing the power source wiring for supplying electric power from outside the package into the chip 121 in the package, M27 is a PMOS transistor having a gate to which a reference voltage Bias is applied, a source connected to the power source line 135, and a drain connected to the common source of the PMOS transistors M25, M26 for composing a constant current generator, and the other elements with the same reference numbers as in FIG. 23 represent the corresponding parts in FIG. 23.

The transistor M22 or M27 is a constant current generator passing a specific current, and their gates are connected bias voltage terminals 106, 116, and a voltage Bias (bias voltage) for operating the transistor M22 or M27 always in saturated region is applied to these gates. The transistors M20, M21 operate as shown in FIG. 24. Usually, back gates, which are ohmic contacts for applying voltages to the bodies of the transistors, of the NMOS transistors M20 to M22 are connected to the power source line 130 in the chip. Meanwhile, in the case of the current source composed of PMOS transistors M25 to M27 as shown in FIG. 27, back gates of the PMOS transistors M25 to M27 are connected to the power source line 135.

Since the conventional current source for switching is constituted in the semiconductor integrated circuit as described above, effects of inductances 131, 136 (herein the value of inductance is supposed to be L) due to wiring cannot be ignored in switching action in high speed operation, and spike noise and signals are generated. As is well known, a sudden voltage fluctuation occurs at the time of switching on the power source line 130 or 135, and therefore an electromotive force in the size given by −Ldi/dt is generated by the inductances 131, 136 of the wiring, thereby causing spike noise or oscillation at the time of turning on or off. This phenomenon is described, for example, in "Latest Technology in Noise Countermeasure," pp. 198–199, SOGO GIJUTSU SHUPPAN, 1986. Hence, measures for reducing the L value of the inductances 131, 136 are needed, for example, by keeping the wiring length as short as possible. Considering, however, the device including up to the package 121 as shown in FIG. 25, since inductances are present in the wire 124 from the internal pad 122 of the chip 120 to the inside of the package, in the pattern 123 from the package inside to the external pin 125, and in the wiring on the board, it is difficult to decrease these inductances.

In particular, in the current source used in the D/A converter, since either one of the transistors M20, M21, or either one of the transistors M25, M26 is always turning on and off alternately, momentary fluctuations of current occur, and as the operation speed becomes faster, effects of voltage generated by -Ldi/dt become greater. That is, in the presence of an inductance, its effect is transmitted to the output current by −Ldi/dt, which induces oscillation (ringing). Consequently, effects of inductances due to voltage fluctuations between the power source lines 130, 136 occur in the back gates of the transistors M20 to M22 or M25 to M27, and noise and oscillation occur in the output current of the current source, which results in causing effects of noise and oscillation on the output of the D/A converter.

SUMMARY OF THE INVENTION

A first aspect of the present invention is related to a current source which comprises first, second, and third power source lines disposed mutually independently; a constant current generator inserted in a specified current path provided between the first and second power source lines; and a first MOS transistor having a gate in which a control signal for controlling the switching action is supplied, a source and a drain inserted in the specified current path so as to be in series to the constant current generator, and a back gate connected to the third power source line, wherein the third power source line supplies a voltage only to the back gate of the first MOS transistor.

In the back gate of the MOS transistor in the first aspect of the invention, a back gate potential is applied through the third power source line. Since the third power source line is connected only to the back gate of the MOS transistor, a voltage oscillatory transient between the first and second power source lines has no effect on the third power source line, it is may be constituted so that a voltage oscillatory transient may be smaller in the voltage between the first power source line and back gate or the voltage between the second power source line and back gate, than in the voltage between the first and second power source lines, thereby alleviating an oscillatory transient of the voltage of the back gate of the MOS transistor due to a voltage oscillatory transient between the first and second power source lines at the time of switching, so that the stability of operation of the MOS transistor may be enhanced.

Therefore, according to the current source of the first aspect of the invention, comprising the MOS transistor having a gate in which a control signal for controlling the switching action is supplied, a source and a drain inserted in the specified current path so as to be in series to the constant current generator, and a back gate connected to the third power source line, the third power source line supplies voltage only to the back gate of the MOS transistor, and hence the current source is obtained such by that the potential of the back gate of the MOS transistor is stable regardless of a voltage oscillatory transient between the first and second power source lines, and that oscillatory transient of the output current can be suppressed small relative to the voltage ocillatory transient between the first and second power source lines by switching of the current source or the like.

A second aspect of the present invention is related to a current source which comprises first and second power source lines disposed mutually independently; a constant current generator having one end and other end connected to the first power source line, and inserted in a specified current path provided between the first and second power source lines; and a first MOS transistor having a gate in which a control signal for controlling the switching action is supplied, a source and a drain inserted in the specified current path so as to be in series to the constant current generator, and a back gate connected to the source of the first MOS transistor and the other end of the constant current generator.

In the MOS transistor of the second aspect of the invention, since its source and back gate are connected to the other end of the constant current generator, if the voltage between the first and second power source lines fluctuates due to switching action of the MOS transistor, the voltage of the back gate of the MOS transistor is kept stable, so that the operation of the MOS transistor may be stabilized.

Therefore, according to the current source of the second aspect of the invention, comprising the MOS transistor having a gate in which a control signal for controlling the switching action is supplied, a source and a drain inserted in the specified current path so as to be in series to the constant current generator, and a back gate connected to the source and the other end of the constant current generator, the operation of the MOS transistor is prevented from becoming unstable due to an oscillatory transient of the voltage of the back gate of the MOS transistor in spite of a voltage ocillatory transient between the first and second power source lines by switching action, thereby obtaining the current source capable of suppressing oscillatory transient of the output current against a voltage oscillatory transient between the first and second power source lines by switching action of the power source or the like.

A third aspect of the present invention is related to a semiconductor integrated circuit device having a current source, which comprises at least one MOS transistor and is composed to vary an output current value by switching operation of the MOS transistor, included in a semiconductor integrated circuit, comprising: first and second power source lines connected to the current source and composing a first power supply for driving the current source; and third and fourth power source lines connected to the current source and composing a second power supply for only applying a back gate potential of the MOS transistor of the current source.

In the current source of the third aspect of the invention, the back gate of the MOS transistor is provided with a voltage supplied from the third and fourth power source lines, and the second power supply composed of the third and fourth power source lines supplies voltage only to the back gate of the MOS transistor, and therefore the potential of the back gate may be stable regardless of the voltage oscillatory transient in the first power source system due to switching action of the MOS transistor or the like. Accordingly, if the voltage of the first power supply fluctuates due to switching action of the MOS transistor or the like, the operation of the MOS transistor is kept stable.

The semiconductor integrated circuit device of the third aspect of the invention comprises the third and fourth power source lines for composing the second power source system, being connected to the current source, for applying only a back gate potential of the MOS transistor of the current source, and the voltage is supplied to the back gate through the second power source system, separately from the first power source system which drives the current source, and therefore the operation of the MOS transistor for switching is stable by stabilizing the potential of the back gate regardless of the voltage oscillatory transient of the first power source system, thereby obtaining the semiconductor integrated circuit device including the current source capable of suppressing oscillatory transient of the output current against a voltage oscillatory transient between the first and second power source lines due to switching action of the current source or the like.

Preferably, according to a fourth aspect of the present invention, in the semiconductor integrated circuit device of the third aspect, a voltage oscillatory transient of the second power source system is smaller than a voltage oscillatory transient of the first power source system.

In the fourth aspect of the invention, a voltage oscillatory transient of the second power source system is smaller than the voltage oscillatory transient of the first power source system, and the operation of the MOS transistor is further stabilized, so that the operation of the current source may be also stable.

According to the semiconductor integrated circuit device of the fourth aspect of the invention, since the voltage oscillatory transient of the second power source system is smaller than the voltage oscillatory transient of the first power source system, the back gate voltage of the MOS transistor can be further stabilized, and hence it is effective to further suppress the oscillatory transient of the output current of the current source incorporated in the semiconductor integrated circuit device.

Preferably, according to a fifth aspect of the present invention, the semiconductor integrated circuit device of the third aspect further comprises a constant voltage power source disposed in the semiconductor integrated circuit, and connected to the third and fourth power source lines, for supplying a voltage to the second power supply.

The constant voltage power source in the fifth aspect of the invention is provided in the semiconductor integrated circuit, and by supplying a voltage of one system into the semiconductor integrated circuit device from outside, the current source in the semiconductor integrated circuit device can be operated while supplying voltage into the back gate of the MOS transistor for composing the current source by using a second power supply.

Therefore, since the semiconductor integrated circuit device of the fifth aspect of the invention comprises the constant voltage power source provided in the semiconductor integrated circuit for supplying a voltage into the second power supply, the number of terminals can be curtailed, and the number of power sources to be connected to the semiconductor integrated circuit device is also curtailed, so that it is easier to use.

Preferably, according to a sixth aspect of the present invention, in the semiconductor integrated circuit device of the third aspect, the first power source line and the third power source line are connected.

In the sixth aspect of the invention, the first and third power source lines are connected, and therefore the terminals and power source lines for supplying voltage to the semiconductor integrated circuit can be saved.

Therefore, since the first and third power source lines are connected in the semiconductor integrated circuit device of the sixth aspect of the invention, the number of terminals and number of power source lines can be curtailed, and the scale of integration of semiconductor integrated circuit can be enhanced.

Preferably, according to a seventh aspect of the present invention, the semiconductor integrated circuit device of the sixth aspect further comprises a first constant current generator connected to the first and second power source lines and inserted in a specified current path; and at least one of the MOS transistor includes a first MOS transistor having a gate in which a control signal for controlling the switching action is fed, a source and a drain connected in series to the specified current path, and a back gate connected to the fourth power source line.

In the back gate of the MOS transistor in the seventh aspect, a back gate potential is applied through the second power supply. Since this second power supply is connected only to the back gate of the MOS transistor, the voltage oscillatory transient between the first and second power source lines has no effect on the voltage between the third and fourth power source lines, and the voltage oscillatory transient of the second power supply may be set smaller than the voltage oscillatory transient of the first power source system, and hence oscillatory transient of the voltage of back gate of the MOS transistor due to a voltage oscillatory transient between the first and second power source lines at the time of switching can be lessened, so that the stability of operation of the MOS transistor may be enhanced.

Therefore, the semiconductor integrated circuit device in the seventh aspect of the invention possesses the first MOS transistor comprising a gate in which a control signal for controlling the switching is supplied, a source and a drain connected in series to the specified current path, and a back gate connected to the fourth power source line, so that the operation of the first MOS transistor inserted in series in the specified current path for switching can be stabilized, thereby easily obtaining the semiconductor integrated circuit device including the current source capable of suppressing a small oscillatory transient of the output current against a voltage oscillatory transient between the first and second power source lines by switching of the current source or the like.

Preferably, according to an eighth aspect of the present invention, the semiconductor integrated circuit device of the seventh aspect further comprises a second constant current generator in the same constitution as the first constant current generator, having one end and other end connected to the first power source line; and a second MOS transistor of a same conductivity type as the first MOS transistor, having a gate connected to the fourth power source line, a source connected to the other end of the second constant current generator, and a drain connected to the second power source line, wherein a voltage to be supplied to the second power supply is generated between the source of the second MOS transistor and the first power source line.

The second constant voltage power source in the eighth aspect of the invention is composed of the second constant current generator and the second MOS transistor, and they can be manufactured in the semiconductor integrated circuit in the same manufacturing process as the first constant current generator and the first MOS transistor.

In the semiconductor integrated circuit device of the eighth aspect of the invention, the constant voltage power source comprises the second constant current generator in the same constitution as the first constant current generator, having one end and other end connected to the first power source line, and the second MOS transistor of a same conductivity type as the first MOS transistor, having the gate connected to the fourth power source line, the source connected to the other end of the second constant current generator, and the drain connected to the second power source line, and therefore the constant voltage power source for supplying a voltage to the second power supply can be formed in the semiconductor integrated circuit in the same manufacturing process as the current source, so that the manufacture may be easy.

It is therefore an object to the present invention to provide a current source and a semiconductor integrated circuit device capable of suppressing occurrence of noise and vibration due to effects of inductances in order to solve the problems of the prior art.

These and other objects, features, aspects and advantages of the present invention will become more apparent from the following description of the present invention when taken in conjunction with the accompanying drawings.

DESCRIPTION OF THE PREFERRED EMBODIMENTS

First Preferred Embodiment

Figure 1:
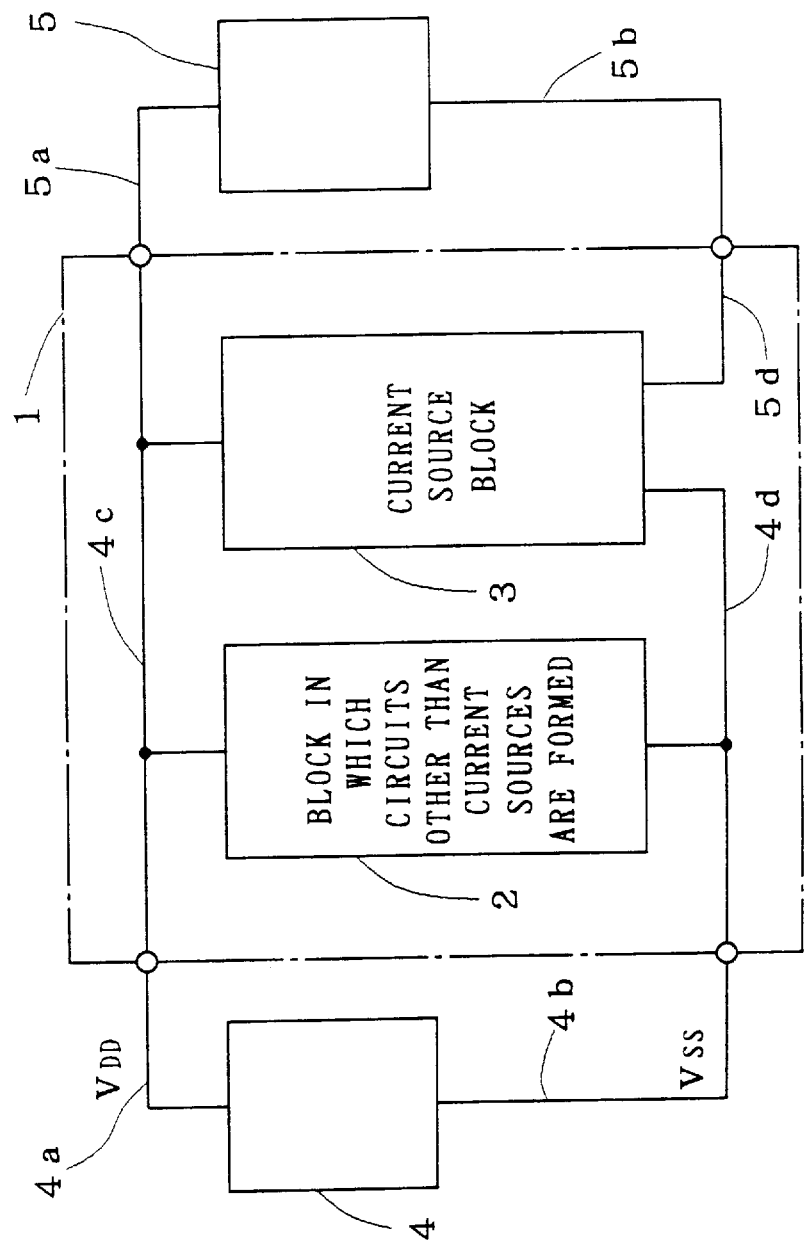
FIG. 1 is a block diagram of a semiconductor integrated circuit device in a first preferred embodiment of the invention.
Figure 2:
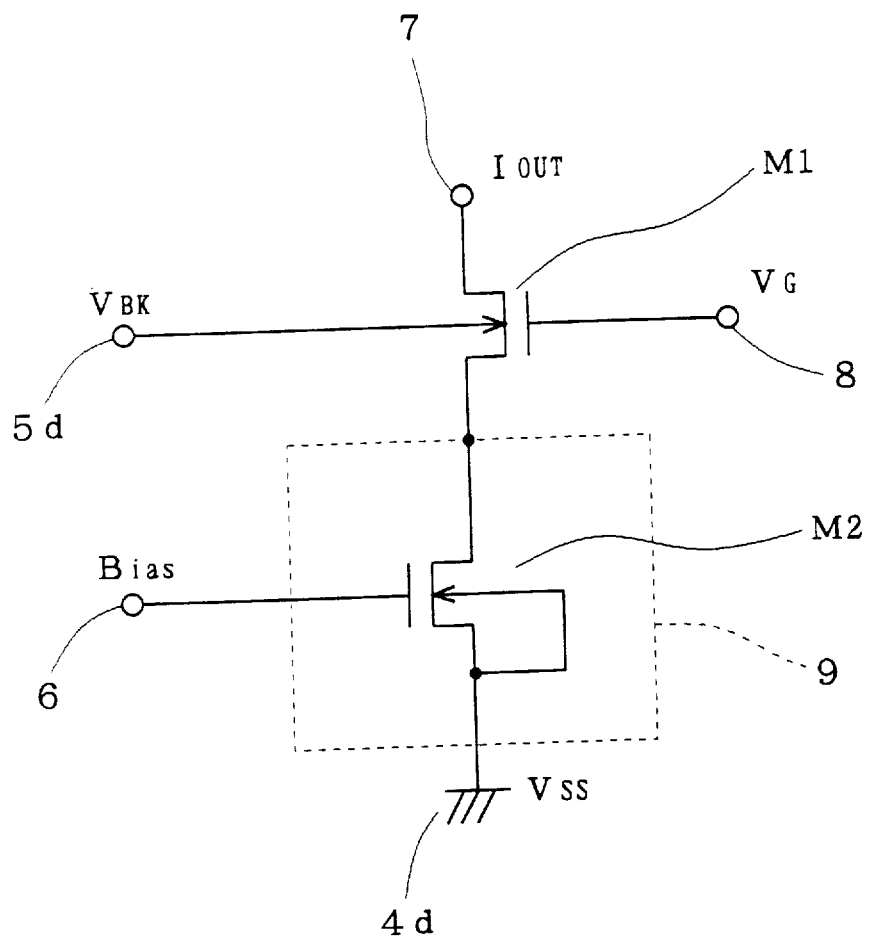
FIG. 2 is a circuit diagram showing an example of a constitution of a current source in the first preferred embodiment of the invention.
Figure 3:
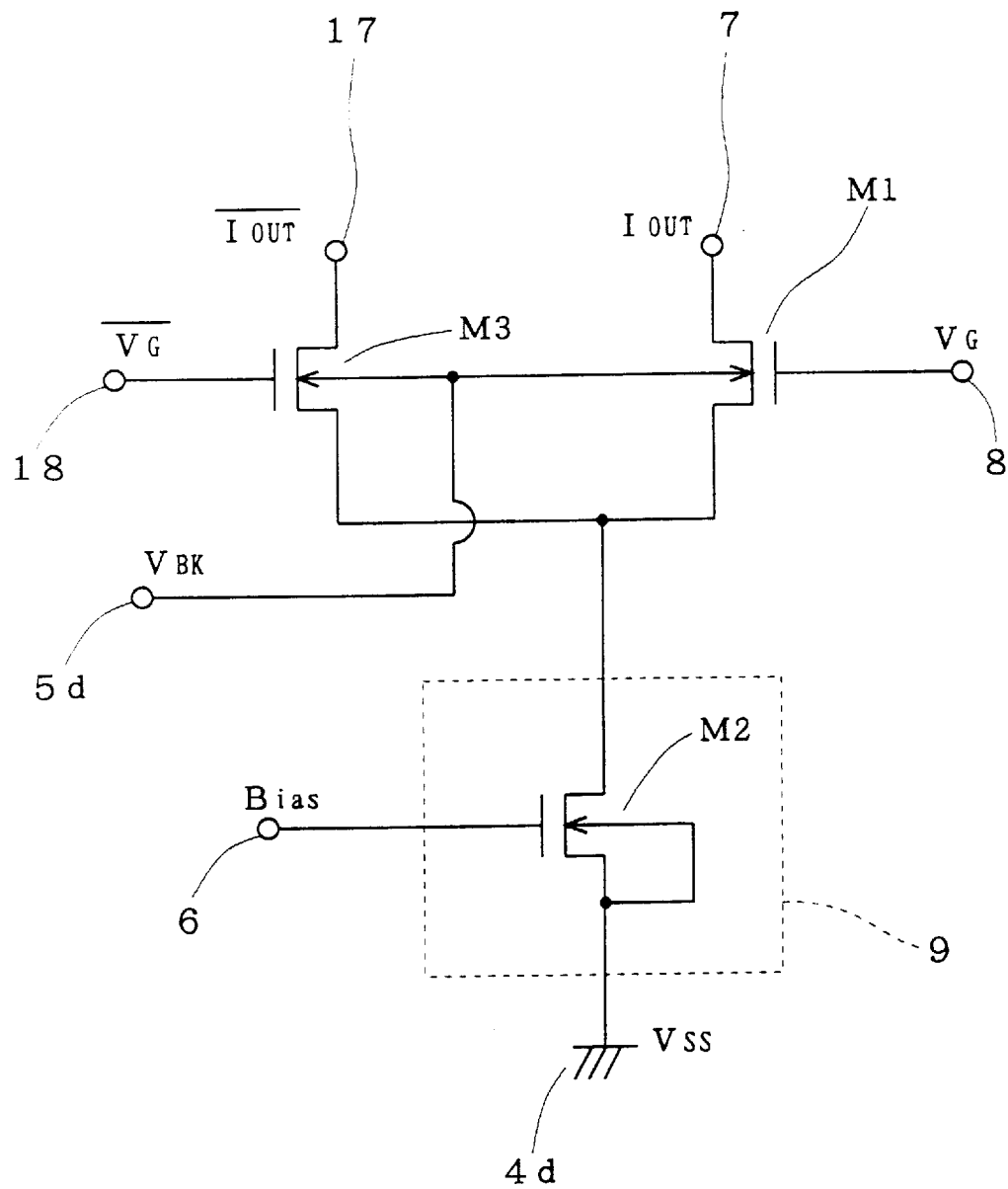
FIG. 3 is a circuit diagram showing other example of a constitution of the current source in the first preferred embodiment of the invention.

Referring now to FIG. 1 through FIG. 3, a semiconductor integrated circuit device according to a first preferred embodiment is described in detail below. FIG. 1 is a block diagram illustrating the constitution of the semiconductor integrated circuit device in the first preferred embodiment of the invention. In FIG. 1, reference numeral 1 denotes a semiconductor integrated circuit for composing the semiconductor integrated circuit device, 2 is a block in which circuits other than current sources are formed, being formed in the semiconductor integrated circuit 1, 3 is a current source block in which plural current sources are provided, being formed in the semiconductor integrated circuit 1, 4 is a constant voltage power source for supplying a driving voltage to the semiconductor integrated circuit 1 from outside into the block 2 forming circuits other than current sources and the block 3 forming current sources, and 5 is a constant voltage power source for supplying a voltage to the semiconductor integrated circuit 1 from outside for stabilizing the operation of the current sources in the current source block 3. The current sources in the block 3 are current sources capable of turning on or off the current by switching by a MOS transistor or varying the current value.

The circuits formed in the blocks 2, 3 in the semiconductor integrated circuit 1 are operated by the driving voltage supplied from the constant voltage power source 4. This driving voltage is supplied into the semiconductor integrated circuit 1 through power source lines 4a, 4b for connecting between the semiconductor integrated circuit 1 and constant voltage power source 4. Furthermore, through power source lines 4c, 4d provided in the semiconductor integrated circuit 1 connected to the power source lines 4a, 4b, respectively, the driving voltage is also supplied into the blocks 2, 3. In the semiconductor integrate circuit 1, moreover, a voltage for stabilizing the operation of the current sources in the current source block 3 is supplied from the constant voltage power source 5 through power source lines 5a, 5b. This voltage is further supplied into the block 3 through power source lines 4c, 5d provided in the semiconductor integrated circuit 1 connected respectively to power source lines 5a, 5b.

For example, when the current source is switched by a MOS transistor, by applying the potential of the back gate of the MOS transistor through the voltage of the constant voltage power source 5, the potential at the back gate of the MOS transistor in the current source block 3 can be stabilized. In the case of switching by the current source block 3, if the voltage fluctuates between the power source lines 4c, 4d, this voltage oscillatory transient does not affect the voltage between 4c and 5d, and the back gate potential is stable. Accordingly, the operation of the MOS transistor for composing the current sources in the current source block 3 can be stabilized, and ringing and noise caused in the output current of the current sources can be suppressed. Besides, in the semiconductor integrated circuit 1 shown in FIG. 1, since the power source line 4c for supplying a supply voltage $V_{DD}$ is shared by the constant voltage power sources 4, 5, the number of power source lines in the semiconductor integrated circuit 1 can be curtailed, and the terminals for connecting the power source lines 4a, 5a can be integrated into one, so that the number of terminals can also be curtailed.

Examples of the construction of current sources which are constituent elements of the current source block 3 is described in FIG. 2 and FIG. 3. FIG. 2 is a circuit diagram showing an example of a constitution of the current source in the first preferred embodiment of the invention. In FIG. 2, reference numeral M1 is an NMOS transistor for switching to turn on or off the output current of the current source, and M2 shows an NMOS transistor constituting a constant current generator 9.

The source and back gate of the NMOS transistor M2 are connected to the power source line 4d, and its gate is connected to a bias voltage terminal 6. A voltage Bias is applied to the gate of the transistor M2 so that the transistor M2 may always operate in saturated region.

The source of the NMOS transistor M1 is connected to the drain of the NMOS transistor M2, and the drain of the NMOS transistor M1 is connected to a current output terminal 7. The gate of the NMOS transistor M1 is connected to an input terminal 8 to which a control signal $V_G$ is fed, and the back gate of the NMOS transistor M1 is connected to the power source line 5d which is provided only for supplying a back gate voltage $V_{BK}$.

Although not shown in the diagram, a current $I_{out}$ sent out of the current output terminal 7 flows into the power source line 4c. That is, the NMOS transistors M1, M2 are provided between the power source lines 4c and 4d, and inserted in series in the current path in which the current $I_{out}$ flows.

The back gate voltage $V_{BK}$ of the NMOS transistor M1 is applied through a different power source line 5d from the power source line 4d, and is hence stable regardless of an oscillatory transient of the power source line 4c. Accordingly, if the voltage between the power source lines 4c and 4d fluctuates due to switching of the NMOS transistor M1, the operation of the NMOS transistor M1 is stable, so that the current source can supply a stable output current $I_{out}$.

Figure 24:
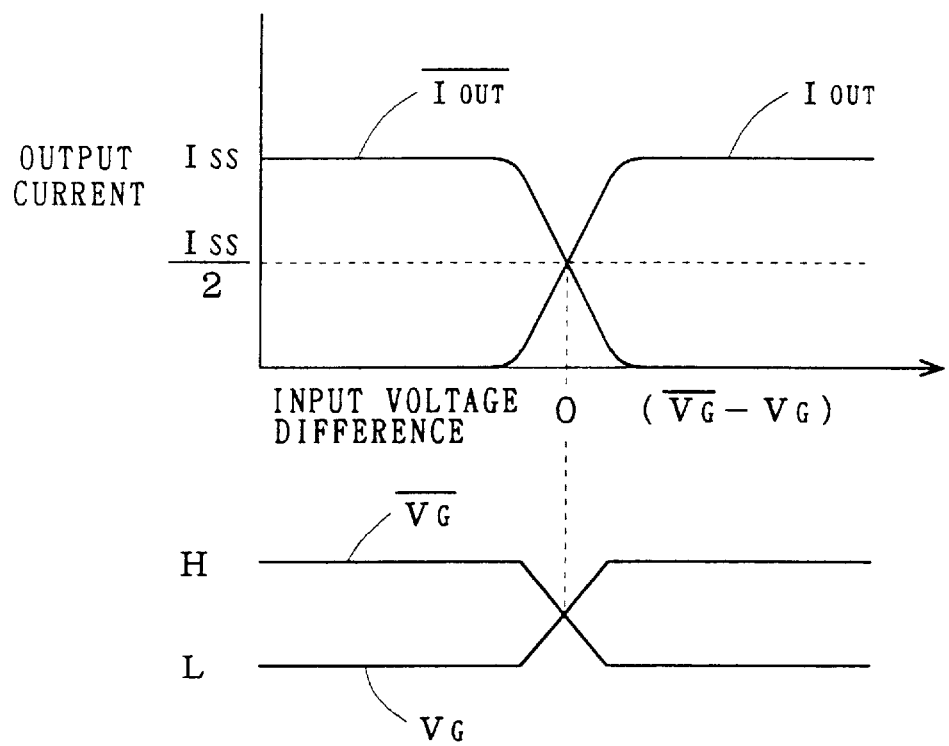
FIG. 24 is a diagram showing the relation between input voltage and output current in the current source in FIG. 22.
Figure 25:
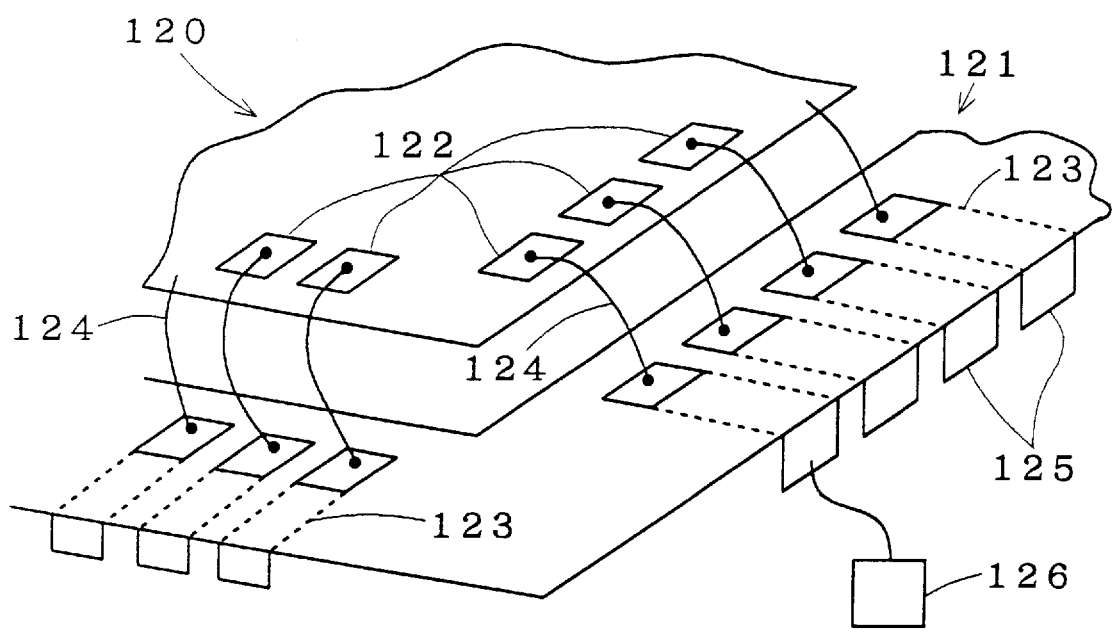
FIG. 25 is a schematic diagram for explaining the constitution of a conventional semiconductor integrated circuit device.

FIG. 3 is a circuit diagram showing another example of a constitution of the current source in the first preferred embodiment of the invention. In FIG. 3, reference numeral M3 denotes an NMOS transistor for switching in the same size as the NMOS transistor M2, and the connections of the other NMOS transistors M1, M2 are same as in the currents source in FIG. 2. The source of the NMOS transistor M3 is connected to the drain of the NMOS transistor M2, and the drain of the NMOS transistor M3 is connected to a current output terminal 17. The back gate of the NMOS transistor M3 is connected to the power source line 5d, and the gate of the NMOS transistor M3 is connected to an input terminal 18 to which a control signal $\overline{V_G}$ complementary to the control signal $V_G$ is applied. The current source shown in FIG. 3 sends out complementary output current $I_{out}$ and $\overline{I_{out}}$ as shown in FIG. 24, respectively from the current output terminals 7, 17. Since the back gate 5d of the NMOS transistors M1, M3 is taken out and connected to the stable bias system outside the chip, the back gate potential of the NMOS transistors M1, M3 is stable, and the current source can send out stable output current $I_{out}$ and $\overline{I_{out}}$.

Second Preferred Embodiment

Figure 4:
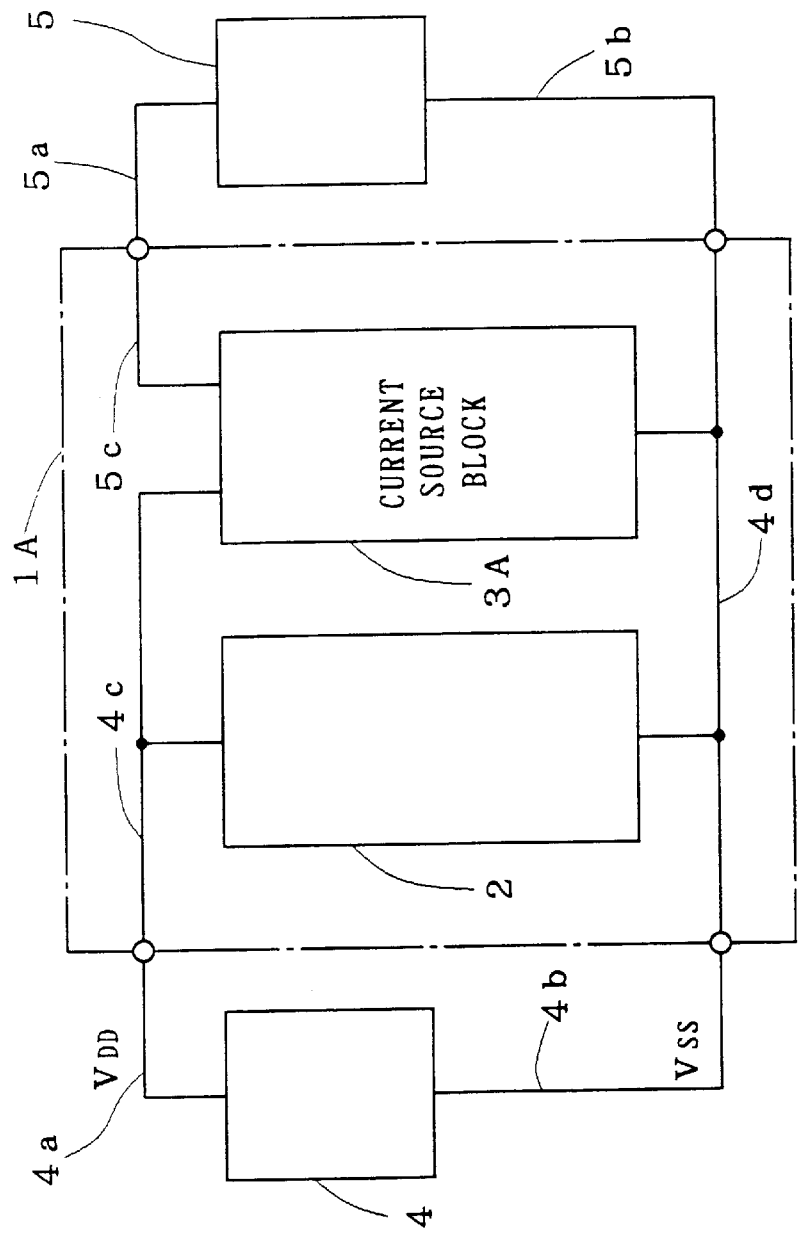
FIG. 4 is a block diagram of a semiconductor integrated circuit device in a second preferred embodiment of the invention.

A semiconductor integrated circuit device according to a second preferred embodiment of the invention is described below while referring to FIG. 4 through FIG. 6. FIG. 4 is a block diagram of the semiconductor integrated circuit device in the second preferred embodiment of the invention. In FIG. 4, reference numeral 1A denotes a semiconductor integrated circuit for composing the semiconductor integrated circuit device, and 3A represents a current source block having plural current sources formed in the semiconductor integrated circuit 1A, and other reference numerals the same as in FIG. 1 indicate corresponding components. The current sources in the block 3A are current sources capable of turning on or off the current by switching by a MOS transistor or varying the current value.

The circuits formed in the blocks 2, 3A in the semiconductor integrated circuit 1A are operated by a driving voltage supplied from the constant voltage power source 4. What the semiconductor integrated circuit 1A shown in FIG. 4 differs from the semiconductor integrated circuit 1 in FIG. 1 is that the power source line 4d for supplying grounding voltage $V_{SS}$ is connected to the power source lines 4b, 5b so as to be used commonly for supplying both the driving voltage and the voltage for stabilizing the current source.

The driving voltage is supplied into the blocks 2, 3A from the constant voltage power source 4 through the power source lines 4a to 4d, same as in the semiconductor integrated circuit 1. In the semiconductor integrated circuit 1A, a voltage for stabilizing the operation of the current sources in the current source block 3A is supplied from the constant voltage power source 5 through power source lines 5a, 5b. This voltage is further supplied into the block 3A through power source lines 5c, 5d provided in the semiconductor integrated circuit 1A and connected respectively to the power source lines 5a, 5b. In this case, same as in the first preferred embodiment, the operation of the MOS transistors composing the current sources in the current source block 3A can be stabilized, and ringing and noise caused in the output current of the current sources can be suppressed. Besides, in the semiconductor integrated circuit 1A shown in FIG. 4, since the power source line 4d for supplying the grounding voltage $V_{SS}$ is commonly shared by the constant voltage power sources 4, 5, the number of power source lines in the semiconductor integrated circuit 1A can be curtailed, and the terminals for connecting the power source lines 4b, 5b can be integrated into one, so that the number of terminals can be curtailed.

Figure 5:
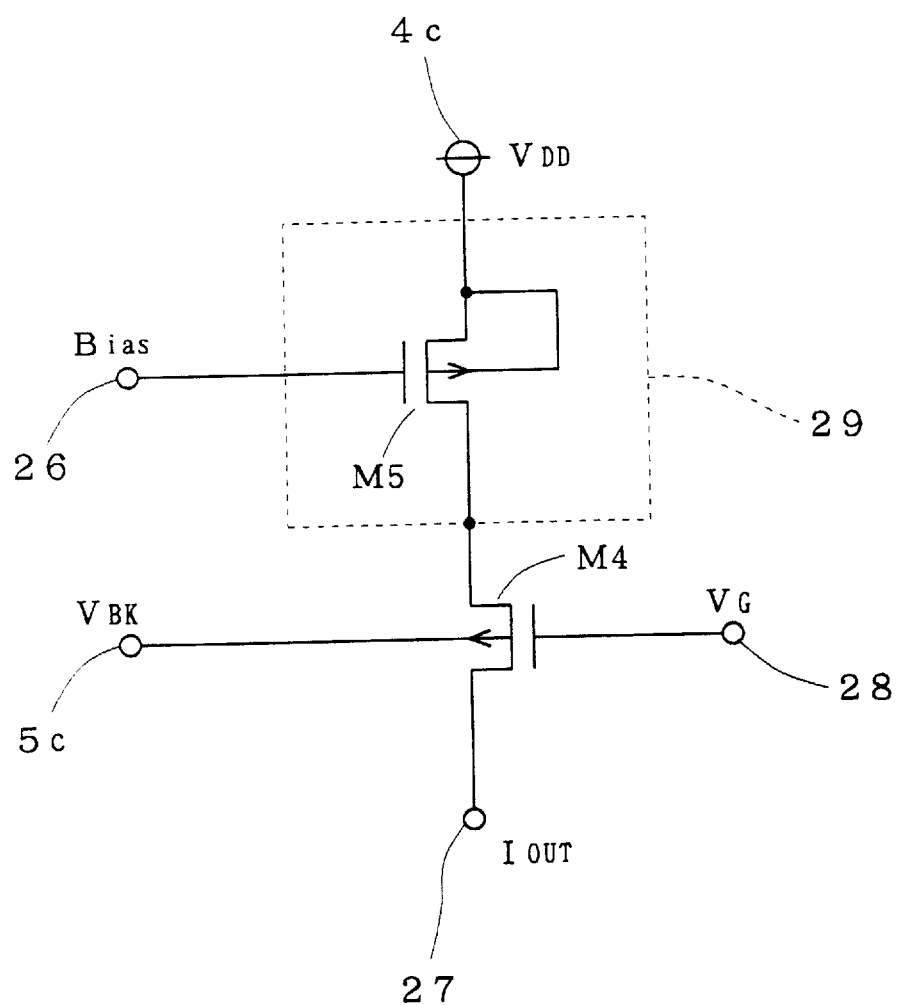
FIG. 5 is a circuit diagram showing an example of a constitution of a current source in the second preferred embodiment of the invention.
Figure 6:
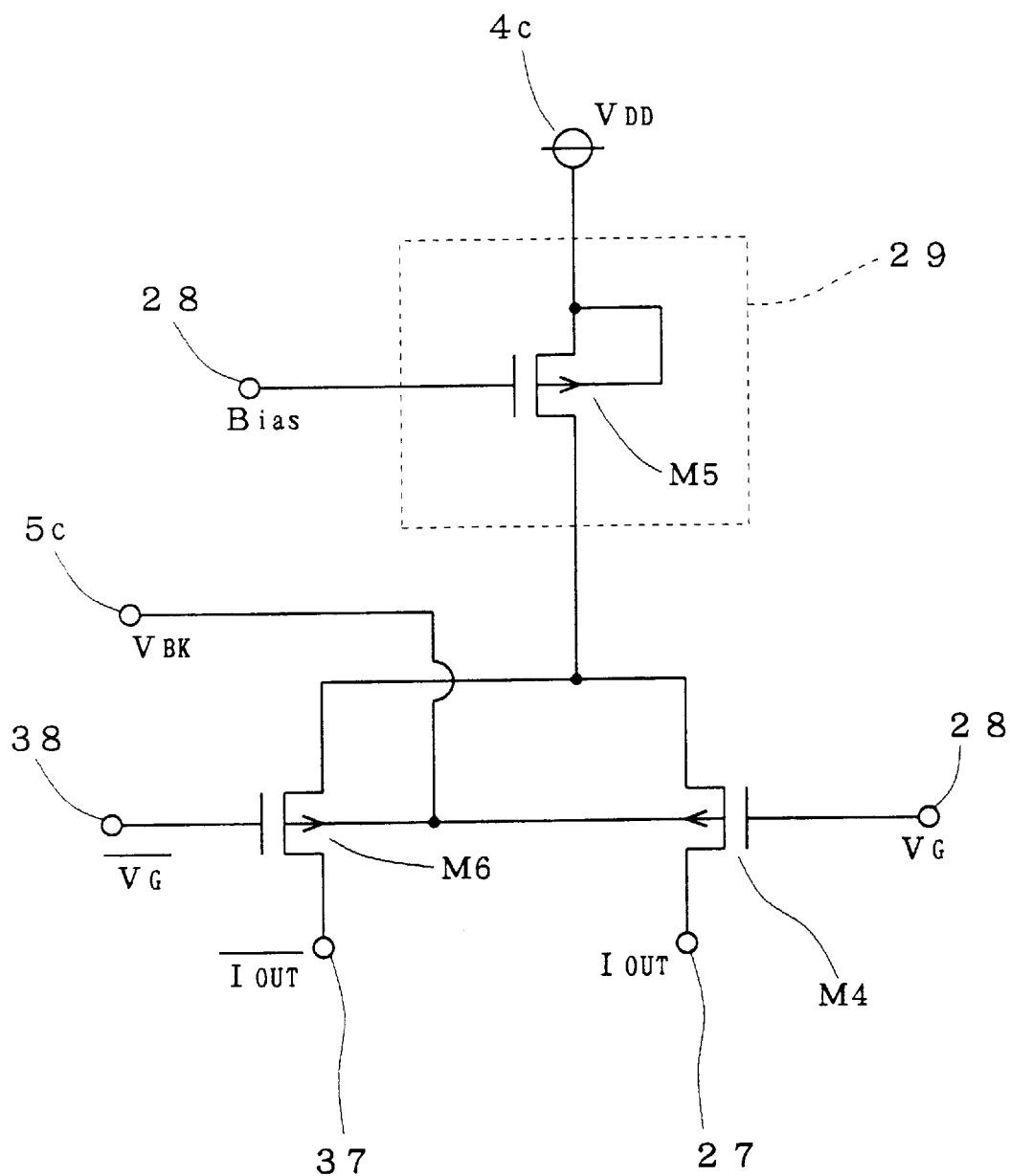
FIG. 6 is a circuit diagram showing other example of a constitution of the current source in the second preferred embodiment of the invention.

Referring to FIG. 5 and FIG. 6, examples of the construction of the current sources as constituent elements of the current source block 3A is described below. FIG. 5 is a circuit diagram showing an example of a constitution of the current source in the second preferred embodiment. In FIG. 5, reference numeral M4 is a PMOS transistor for switching in order to turn on or off the output current of the current source, and M5 is a PMOS transistor for composing a constant current generator 29.

The source and back gate of the PMOS transistor M5 are connected to the power source line 4c, and its gate is connected to a bias voltage terminal 26. A voltage Bias is applied to the gate of the transistor M5 from the bias voltage terminal 26 so that the transistor M5 may operate always in saturated region.

The source of the PMOS transistor M4 is connected to the drain of the PMOS transistor M5, and the drain of the PMOS transistor M4 is connected to a current output terminal 27. The gate of the PMOS transistor M4 is connected to an input terminal 28 to which a control signal $V_G$ is fed, and the back gate of the PMOS transistor M4 is connected to the power source line 5c to which a back gate voltage $V_{BK}$ is applied.

Although not shown in the diagram, the current $I_{out}$ sent out from the current output terminal 27 flows into the power source line 4d. That is, the PMOS transistors M4, M5 are provided between the power source lines 4c and 4d, and are inserted in series to the current path in which the current $I_{out}$ flows.

The back gate voltage $V_{BK}$ of the PMOS transistor M4 is supplied through a different power source line 5c from the power source line 4c, and is hence stable regardless of the oscillatory transient of the power source line 4c. Accordingly, if the voltage between the power source lines 4c and 4d fluctuates by switching of the PMOS transistor M4, the operation of the PMOS transistor M4 is stable, so that the current source can supply stable output current $I_{out}$.

FIG. 6 is a circuit diagram showing another example of a constitution of the current source in the second preferred embodiment of the invention. In FIG. 6, reference numeral M6 denotes a PMOS transistor for switching in the same size as the PMOS transistor MS, and the connections of the other PMOS transistors M4, M5 are the same as in the current source in FIG. 5. The source of the PMOS transistor M6 is connected to the drain of the PMOS transistor MS, and the drain of the PMOS transistor MS is connected to a current output terminal 37. The back gate of the PMOS transistor M6 is connected to the power source line 5c, and the gate of the PMOS transistor M6 is connected to an input terminal 38 to which a control signal $\overline{V_G}$ complementary to the control signal $V_G$ is applied. The current source shown in FIG. 6 sends out complementary output current $I_{out}$ and $\overline{I_{out}}$ respectively from the current output terminals 27, 37. Since the back gate $V_{BK}$ of the PMOS transistors M4, M6 is taken out and connected to the stable bias system outside the chip, the back gate potential of the PMOS transistors M4, M6 is stable, and the current source can send out stable output current $I_{out}$ and $\overline{I_{out}}$.

Third Preferred Embodiment

Figure 7:
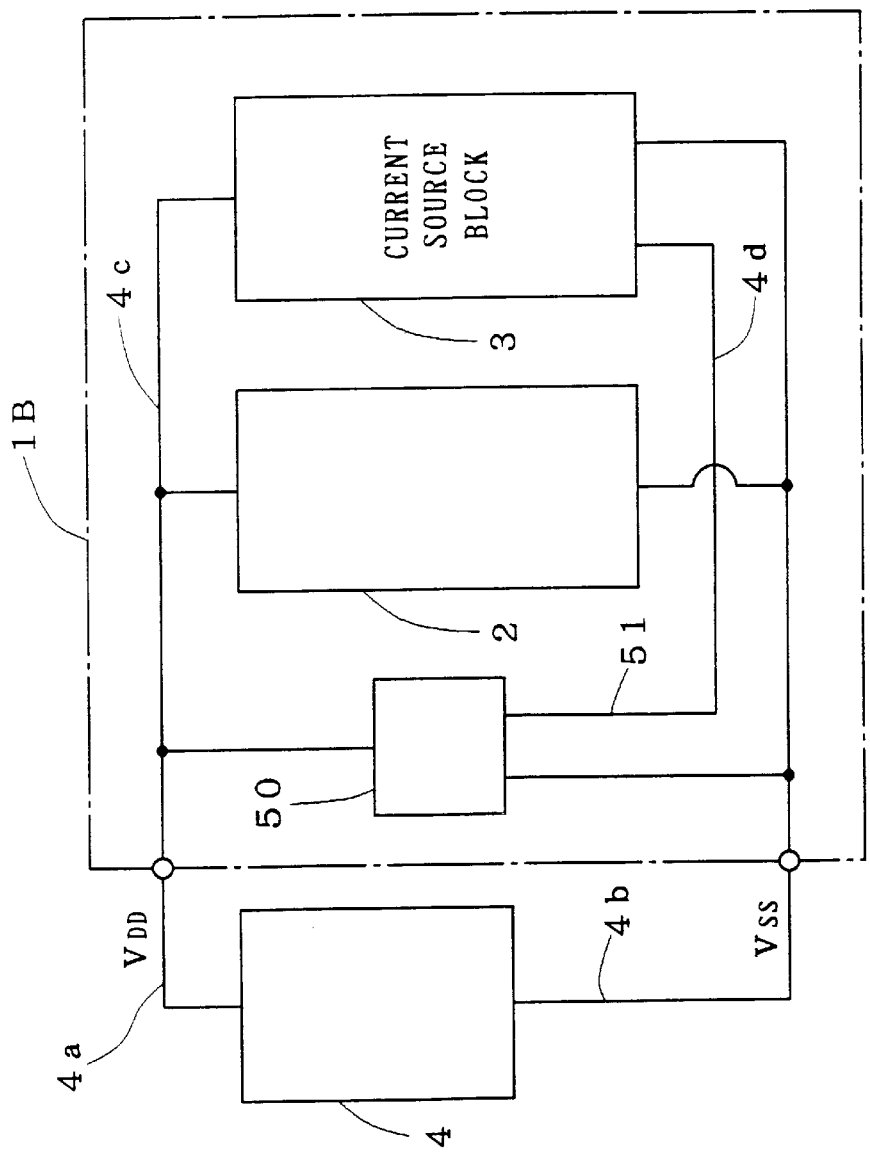
FIG. 7 is a block diagram of a semiconductor integrated circuit device in a third preferred embodiment of the invention.

A semiconductor integrated circuit device according to a third preferred embodiment of the invention is described below with reference to FIG. 7 through FIG. 9. FIG. 7 is a block diagram of the semiconductor integrated circuit device of the third preferred embodiment of the invention. In FIG. 7, reference numeral 1B denotes a semiconductor integrated circuit for composing the semiconductor integrated circuit device, 50 represents a constant voltage power source for supplying a voltage for stabilizing the operation of the current sources in the current source block 3 formed in the semiconductor integrated circuit 1B, and other reference numerals the same as in FIG. 1 indicate corresponding parts in FIG. 1.

The circuits formed in the blocks 2, 3 in the semiconductor integrated circuit 1B are operated by a driving voltage supplied from the constant voltage power source 4 through power source lines 4a to 4d same as in the semiconductor integrated circuit 1 shown in FIG. 1.

From the constant voltage power source 50 provided in the semiconductor integrated circuit 1B, a voltage for stabilizing the operation of the current sources in the current source block 3 is supplied through power source lines 51, 4c.

When the current source is switched by a MOS transistor, by applying the potential of the back gate of the MOS transistor by the voltage from the constant voltage power source 50, the potential of the back gate of the MOS transistor in the current source block 3 can be stabilized. For example, in the case of switching by the current source block 3, if the voltage fluctuates between the power source lines 4c and 4d, the voltage oscillatory transient does not affect the voltage between the power source lines 4c and 51, and the back gate potential is stable. Accordingly, the operation of the MOS transistors composing the current sources in the current source block 3 can be stabilized, and ringing and noise caused in the output current of the current sources can be suppressed. Moreover, by forming the constant voltage power source 50 in the semiconductor integrated circuit 1B, a voltage for stabilizing the back gate voltage of the MOS transistor of the current source can be obtained by supplying a driving voltage by connecting an external constant voltage power source 4 to the semiconductor integrated circuit 1, and it is not necessary to connect two external constant voltage power sources unlike the semiconductor integrated circuits in the first and second preferred embodiments, so that it is easier to use the semiconductor integrated circuit device.

Figure 8:
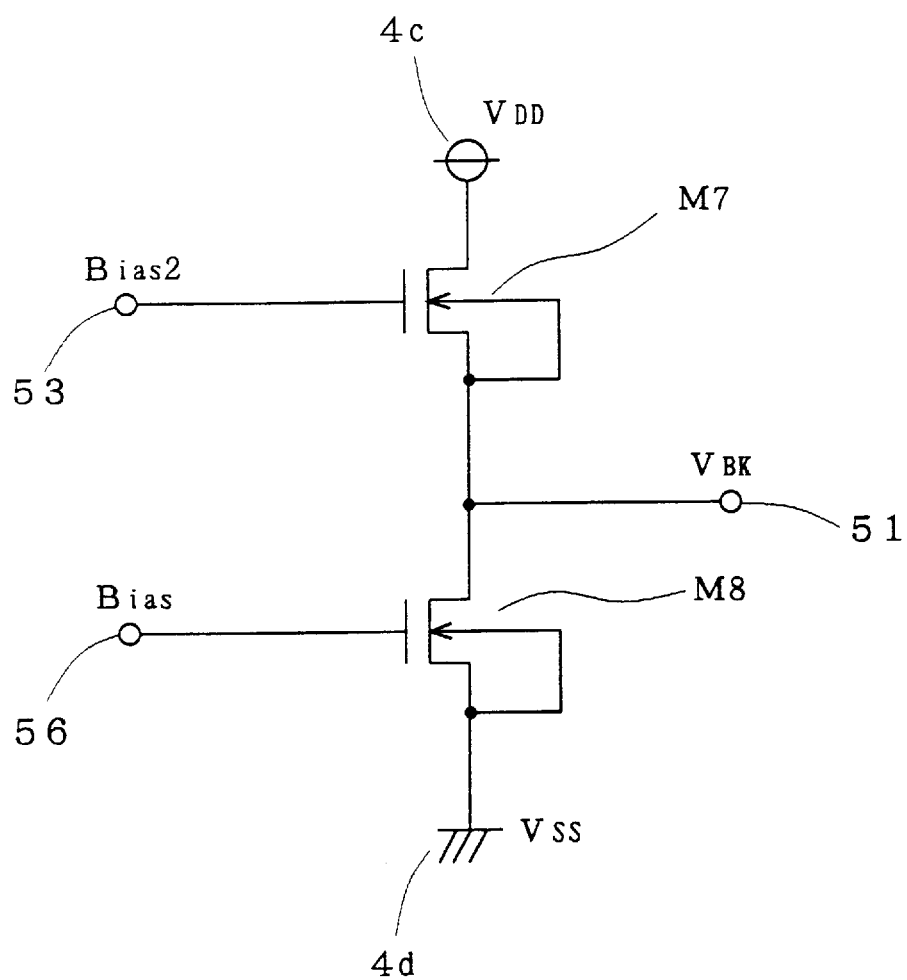
FIG. 8 is a circuit diagram showing an example of a constitution of a constant voltage power source in the third preferred embodiment of the invention.
Figure 9:
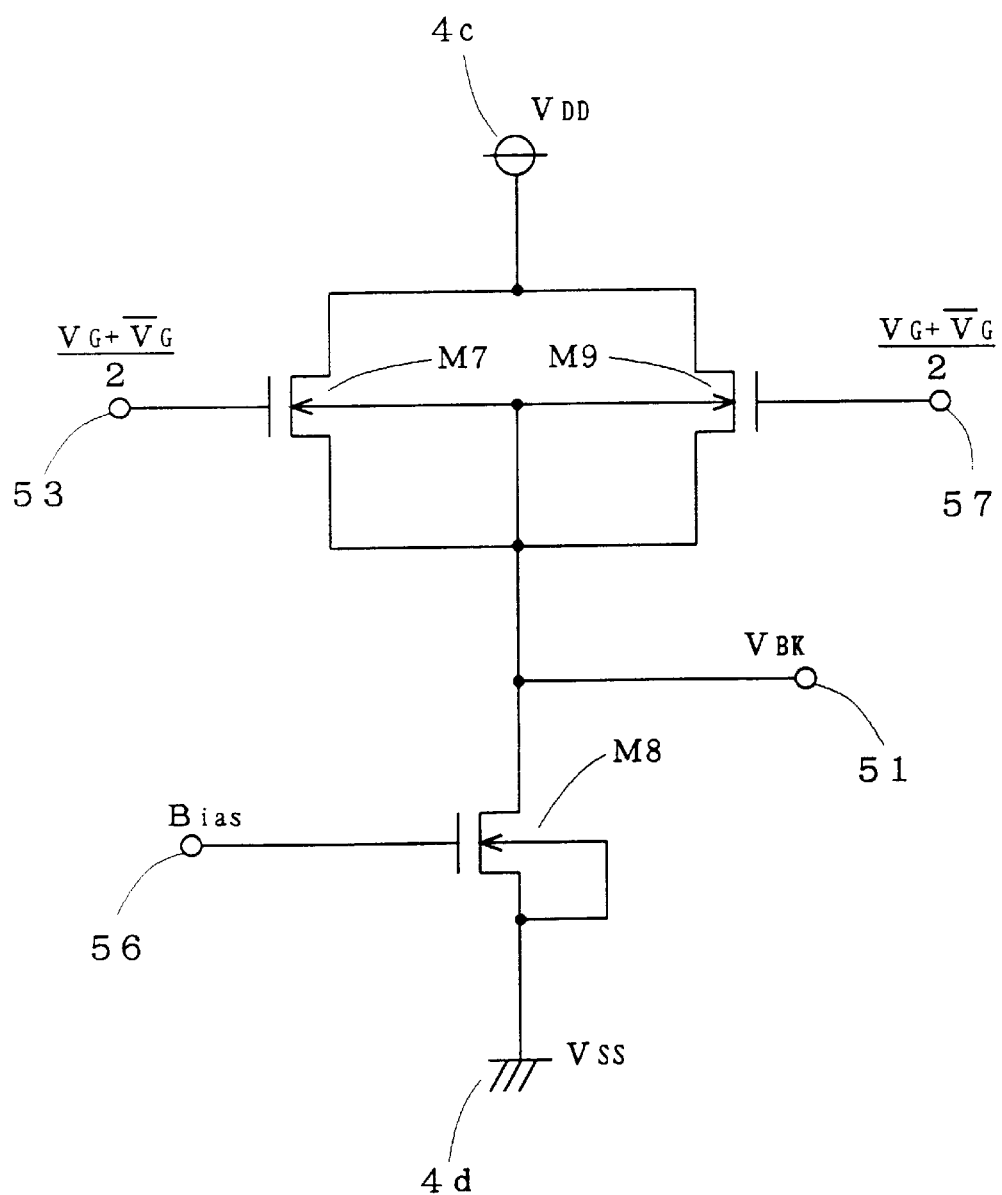
FIG. 9 is a circuit diagram showing other example of a constitution of the constant voltage power source in the third preferred embodiment of the invention.

The constitution of the constant voltage power source 50 is described in FIG. 8 and FIG. 9. FIG. 8 is a circuit diagram showing an example of constitution of the constant voltage power source provided in the semiconductor integrated circuit device in the third preferred embodiment of the invention. In FIG. 8, reference numeral M8 denotes an NMOS transistor having a source and a back gate connected to the power source line 4d, a gate connected to a bias voltage terminal 56, and a drain connected to a voltage output terminal 51, and M7 is an NMOS transistor having a source connected to the drain of the NMOS transistor M8, a drain connected to the power source line 4c, and a gate connected to a bias voltage terminal 53 to which a bias voltage Bias 2 is applied. The NMOS transistor M8 constitutes a constant current generator. Herein, the bias voltage Bias 2 to be applied to the bias voltage terminal 53 may be any constant voltage as far as the NMOS transistor M7 is operated. At this time, a constant drain current flows in the NMOS transistor M7 through the NMOS transistor M8, and a voltage oscillatory transient does not occur in the voltage between the voltage output terminal 51 and power source line 4c, and the back gate sends out a voltage capable of maintaining a stable potential from the voltage output terminal 51.

The NMOS transistor M7 is a transistor in the same size as the NMOS transistor M1 shown in FIG. 2, and the NMOS transistor M8 is a transistor in the same size as the NMOS transistor M2 shown in FIG. 2. Accordingly, the constant voltage power source 50 can be formed in the same process as the current source block 3 and can be manufactured easily.

FIG. 9 is a circuit diagram showing another example of a constitution of the constant voltage power source provided in the semiconductor integrated circuit device in the third preferred embodiment of the invention. In FIG. 9, reference numeral M9 denotes an NMOS transistor having a source connected to the drain of the NMOS transistor M8, a drain connected to the power source line 4c, and a gate connected to a bias voltage terminal 57 to which a bias voltage is applied, same as the NMOS transistor M7. The circuit shown in FIG. 9 has the same circuitry as the current source shown in FIG. 3. A specific in-phase voltage $(V_G+\overline{V_G})/2$ is applied to the gates of the transistors M7 and M9 through the bias voltage terminals 53, 57 so that current oscillatory transient may not occur due to switching action. A bias voltage Bias same as in the circuit in FIG. 3 is applied to the transistor M8 from the bias voltage terminal 56 so as to be used as a constant current generator.

In this case, since a constant voltage is applied to the NMOS transistors M7, M9, a specific drain current flows, and a voltage oscillatory transient does not occur in the voltage between the voltage output terminal 51 and power source line 4c to which the back gates of the NMOS transistors M7, M9 are connected, and the voltage between the voltage output terminal 51 and power source line 4c is stable. Therefore, a stable voltage may be supplied to the current source block 3 shown in FIG. 7.

Fourth Preferred Embodiment

Figure 10:
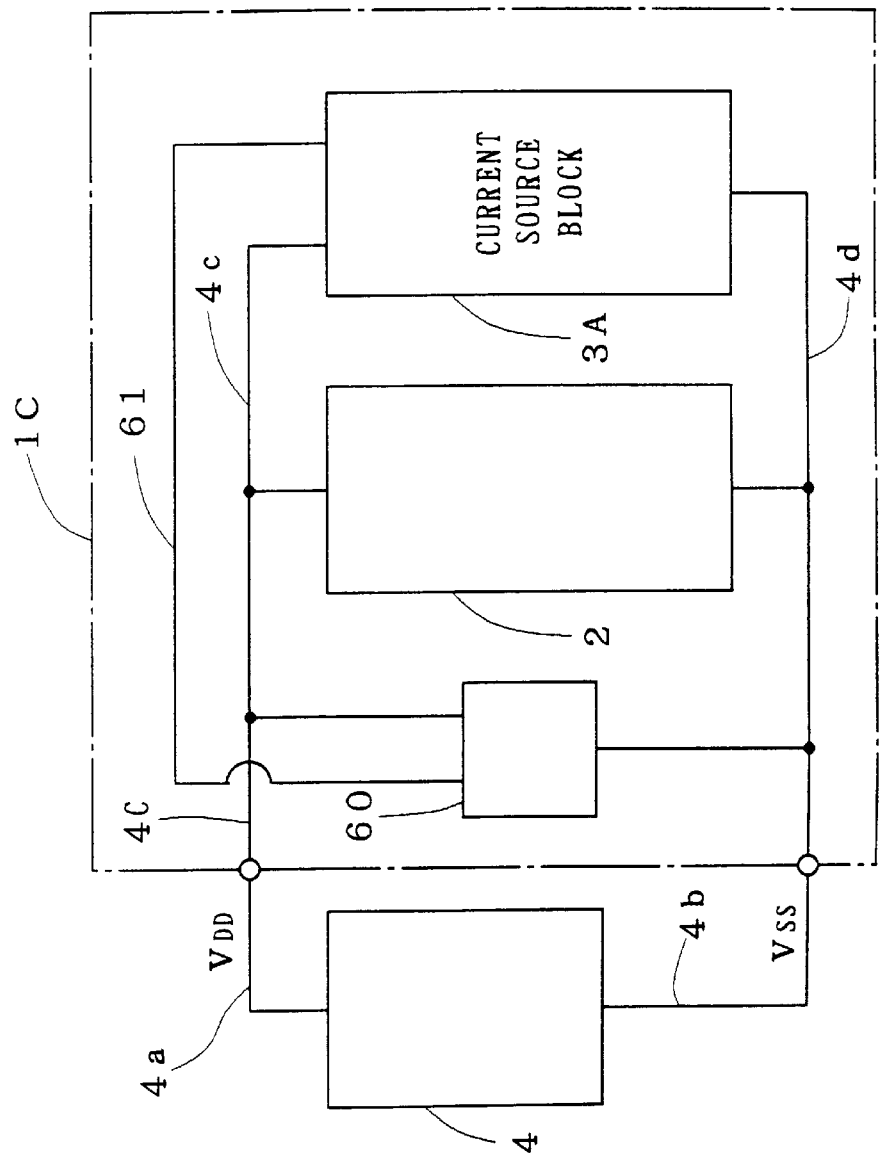
FIG. 10 is a block diagram of a semiconductor integrated circuit device in a fourth preferred embodiment of the invention.

A semiconductor integrated circuit device in a fourth preferred embodiment of the invention is described below with reference to FIG. 10 through FIG. 12. FIG. 10 is a block diagram of the semiconductor integrated circuit device according to the fourth preferred embodiment of the invention. In FIG. 10, reference numeral 1C denotes a semiconductor integrated circuit for composing the semiconductor integrated circuit device, 60 represents a constant voltage power source for supplying voltage for stabilizing the operation of the current source of the current source block 3 formed in the semiconductor integrated circuit 1C, and other reference numerals the same as in FIG. 4 indicate corresponding parts in FIG. 4.

The circuits formed in the blocks 2, 3A in the semiconductor integrated circuit 1C are operated by a driving voltage supplied from the constant voltage power source 4 through power source lines 4a to 4d, same as the semiconductor integrated circuit 1A shown in FIG. 4.

Besides, a voltage for stabilizing the operation of the current source in the current source block 3A is supplied from the constant voltage power source 60 provided in the semiconductor integrated circuit 1C through power source lines 61, 4d. When the current source is switched by the MOS transistor, by applying the potential of the back gate of the MOS transistor by the voltage of the constant voltage power source 60, the potential of the back gate of the MOS transistor in the current source block 3A can be stabilized. For example, if the voltage between the power source lines 4c, 4d should fluctuate in the case of switching by the current source block 3A, its voltage oscillatory transient does not affect the voltage between the power source lines 4d and 61, and the back gate potential is stable. Accordingly, the operation of the MOS transistor for composing the current source in the current source block 3a can be stabilized, thereby suppressing the occurrence of ringing or noise in the output current of the current source.

Figure 11:
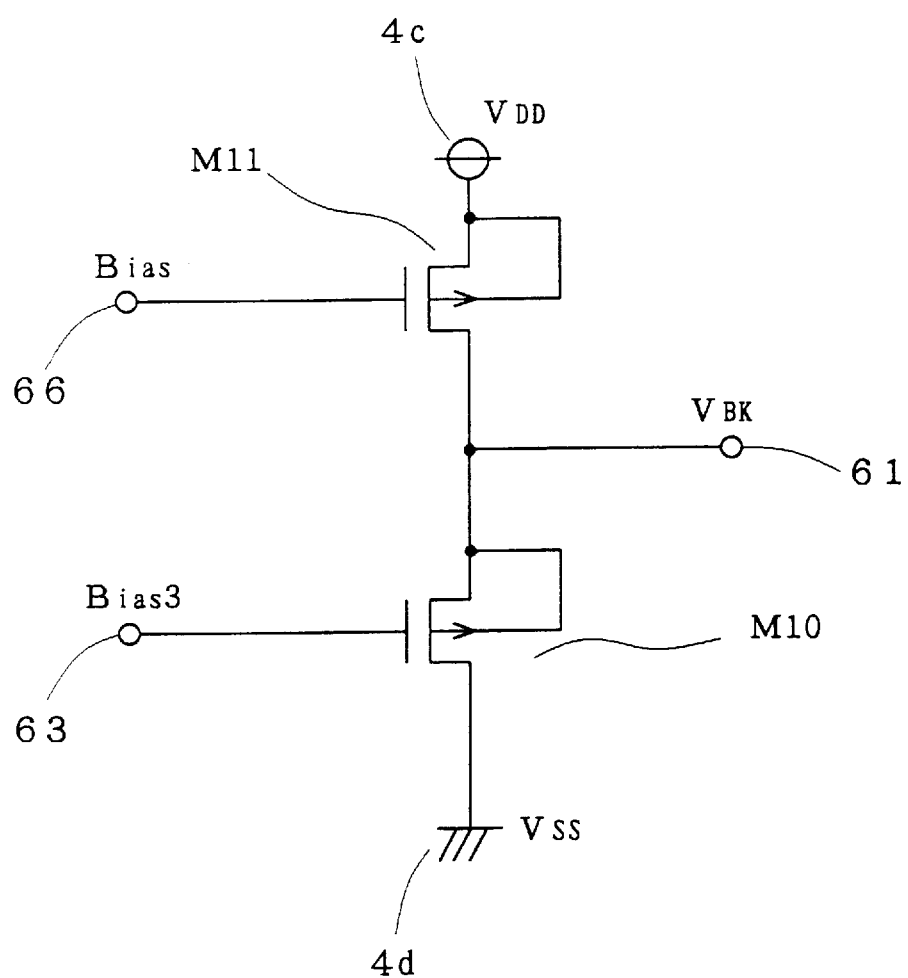
FIG. 11 is a circuit diagram showing an example of a constitution of a constant voltage power source in the fourth preferred embodiment of the invention.
Figure 12:
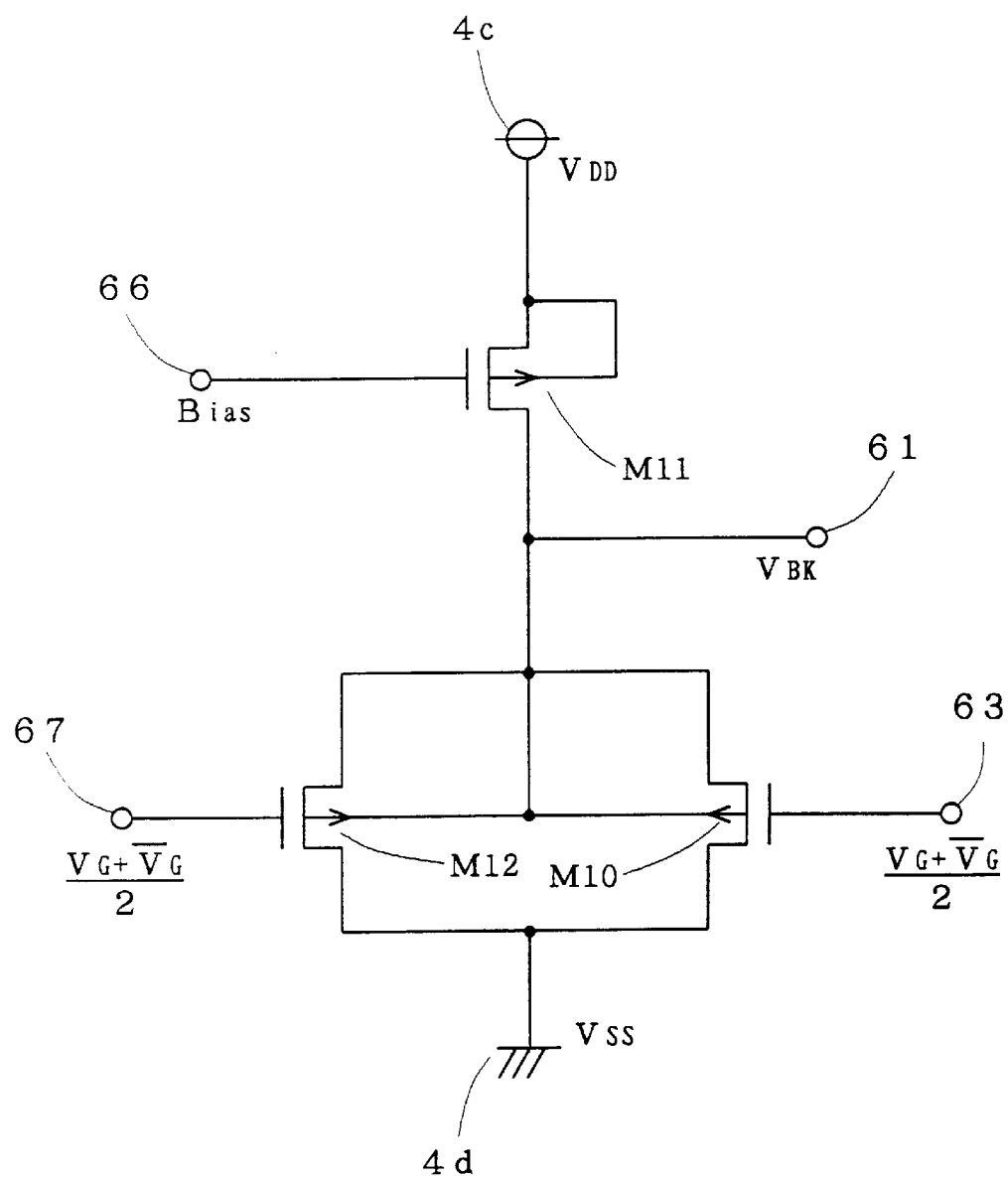
FIG. 12 is a circuit diagram showing other example of a constitution of the constant voltage power source in the fourth preferred embodiment of the invention.

Referring to FIG. 11 and FIG. 12, examples of the constitution of the constant voltage power source 60 is described below. FIG. 11 is a circuit diagram showing an example of a constitution of the constant voltage power source provided in the semiconductor integrated circuit in the fourth preferred embodiment. In FIG. 11, reference numeral M11 denotes a PMOS transistor having a source and a back gate connected to the power source line 4c, a gate connected to a bias voltage terminal 66, and a drain connected to a voltage output terminal 61, and M10 is a PMOS transistor having a source connected to the drain of the PMOS transistor M11, a drain connected to the power source line 4d, and a gate connected to a bias voltage terminal 63 to which a bias voltage Bias 3 is applied. The PMOS transistor M11 constitutes a constant current generator. Herein, the bias voltage Bias 3 to be applied to the bias voltage terminal 63 may be any constant voltage as far as the PMOS transistor M10 is operated. At this time, a constant drain current flows in the PMOS transistor M10 through the PMOS transistor M11, and voltage oscillatory transient does not occur in the voltage between the voltage output terminal 61 and power source line 4c, and the back gate sends out a voltage capable of maintaining a stable potential from the voltage output terminal 61.

The PMOS transistor M10 is a transistor in the same size as the PMOS transistor M5 shown in FIG. 5, and the PMOS transistor M11 is a transistor in the same size as the PMOS transistor M4 shown in FIG. 5. Accordingly, the constant voltage power source 60 can be formed in the same process as the current source block 3A and can be manufactured easily.

FIG. 12 is a circuit diagram showing another example of a constitution of the constant voltage power source provided in the semiconductor integrated circuit device in the fourth preferred embodiment of the invention. In FIG. 12, reference numeral M12 denotes a PMOS transistor having a source connected to the drain of the PMOS transistor M11, a drain connected to the power source line 4d, and a gate connected to a bias voltage terminal 67 to which a bias voltage is applied, same as the PMOS transistor M10. The circuit shown in FIG. 12 has the same circuitry as the current source shown in FIG. 3. A specific in-phase voltage $(V_G+\overline{V_G})/2$ is applied to the gates of the transistors M10 and M12 through the bias voltage terminals 63, 67 so that current oscillatory transient may not occur due to switching action. A bias voltage Bias same as in the circuit in FIG. 3 is applied to the transistor M11 from the bias voltage terminal 66 so as to be used as a constant current generator.

In this case, since a constant voltage is applied to the PMOS transistors M10, M12, a specific drain current flows, and a voltage oscillatory transient does not occur in the voltage between the voltage output terminal 61 and power source line 4d to which the back gates of the PMOS transistors M10, M12 are connected, and the voltage between the voltage output terminal 61 and power source line 4d is stable. Therefore, a stable voltage may be supplied to the current source block 3A shown in FIG. 10.

Fifth Preferred Embodiment

Figure 13:
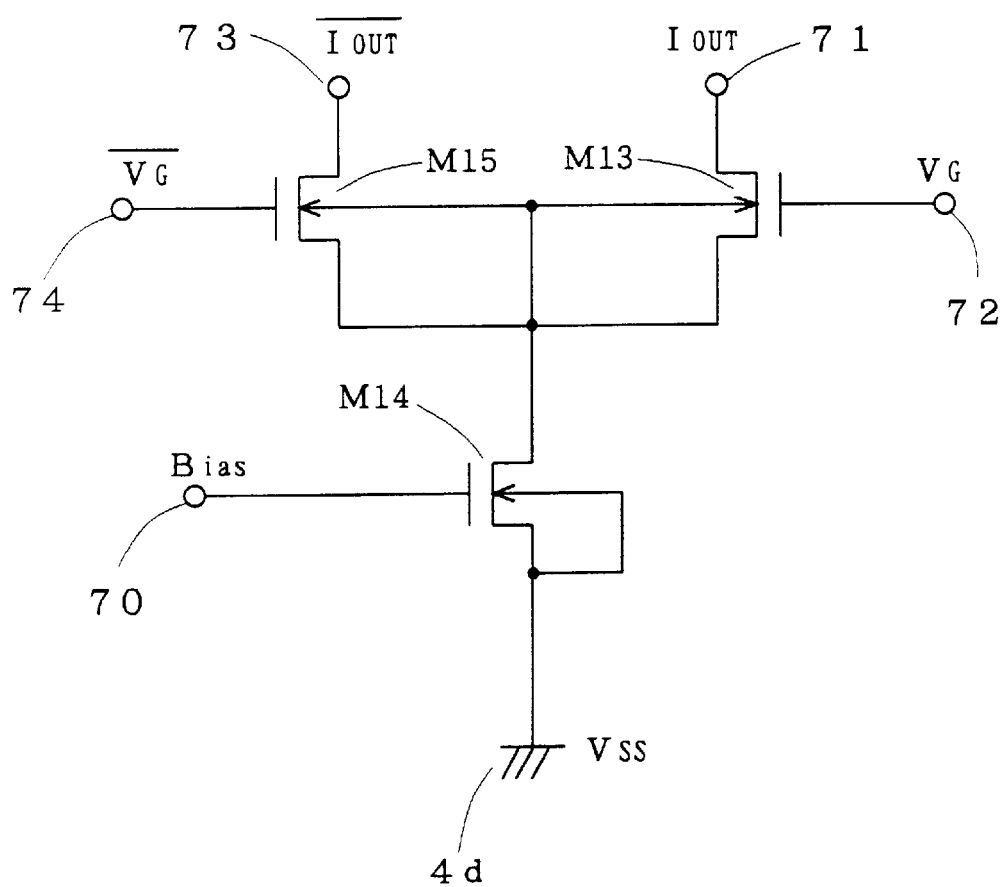
FIG. 13 is a circuit diagram of a current source in a fifth preferred embodiment of the invention.

A fifth preferred embodiment of the invention is described below while referring to FIG. 13 through FIG. 16. FIG. 13 is a circuit diagram showing the construction of a current source provided in the semiconductor integrated circuit device according to the fifth preferred embodiment of the invention. In FIG. 13, reference numeral M13 denotes an NMOS transistor having a gate connected to an input terminal 72, a drain connected to a current output terminal 71, and mutually connected source and back gate, reference numeral M15 is an NMOS transistor having a gate connected to an input terminal 74, a drain connected to a current output terminal 73, and a source and a gate connected to the source of the NMOS transistor M13, and M14 represents an NMOS transistor having a drain connected to the sources of the NMOS transistors M13, M15, a gate connected to a bias voltage terminal 70, and a source and a back gate connected to the power source line 4d.

Complementary control signals $V_G$ and $\overline{V_G}$ are supplied to the gates of the NMOS transistors M13, M15 from input terminals 72, 74, respectively, and when either one of the NMOS transistors M13, M15 is turned on and the other is turned off, complementary output current $I_{out}$ and $\overline{I_{out}}$ are supplied.

Figure 26:
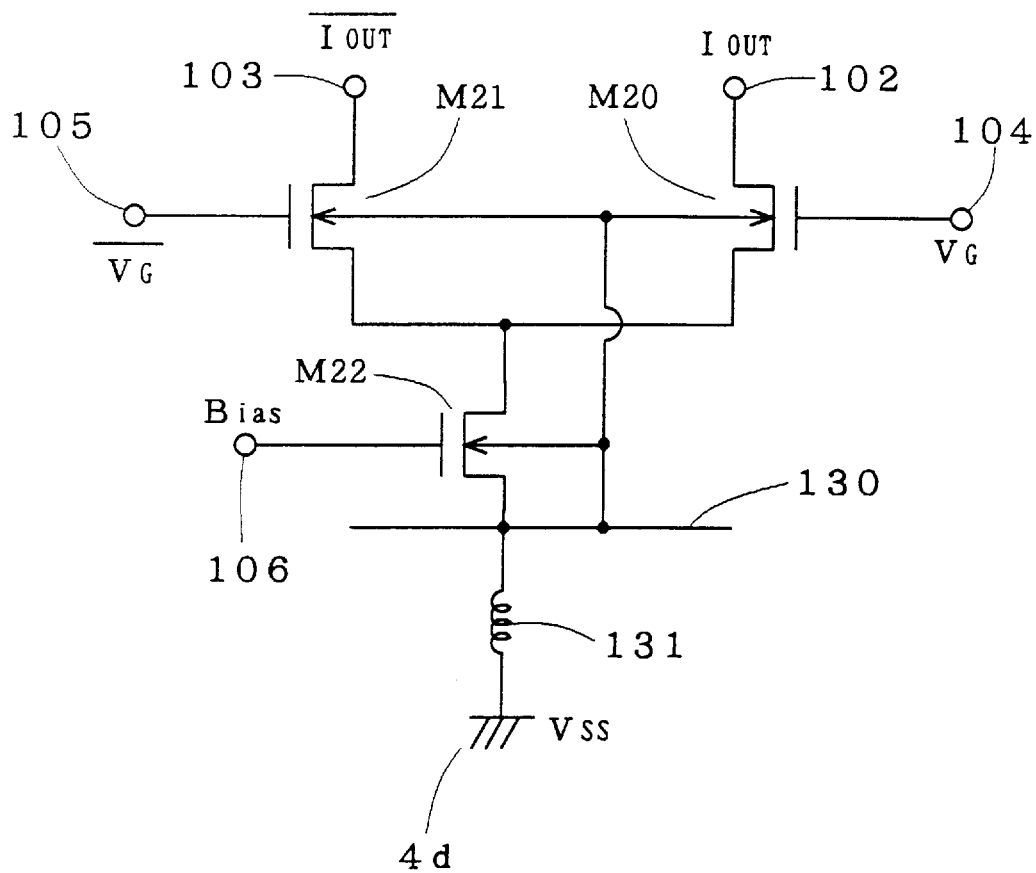
FIG. 26 is a circuit diagram for explaining problems of a conventional current source.

The back gates of the NMOS transistors M13, M15 are connected to the common source of the NMOS transistors M13, M15. Accordingly, as compared with the conventional current source connected to the source of the transistor M22 for supplying a constant current shown in FIG. 26, the output current is stable in the current source shown in FIG. 13.

Figure 14:
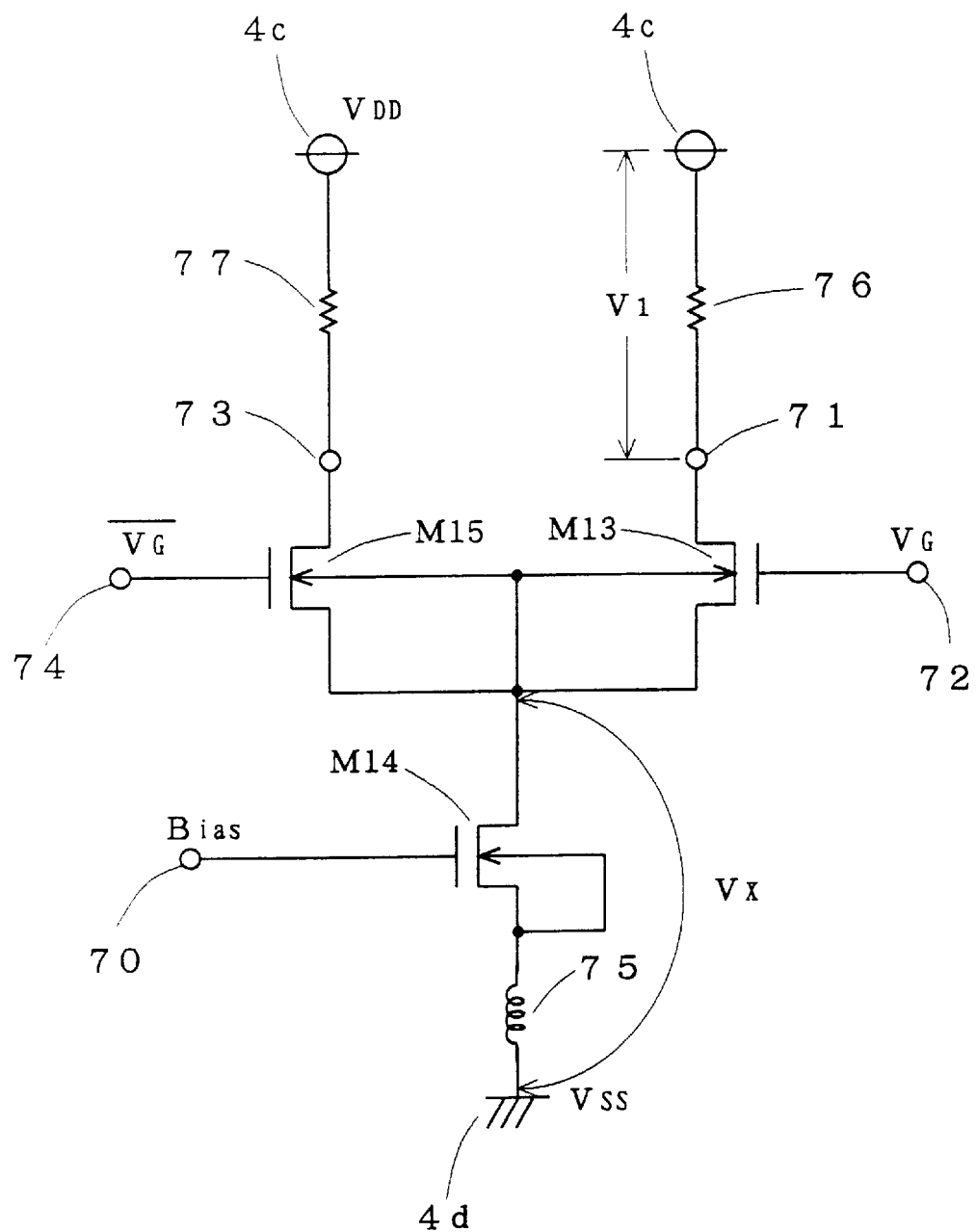
FIG. 14 is a circuit diagram showing conditions for simulation of operation of the current source in the fifth preferred embodiment of the invention.
Figure 15:
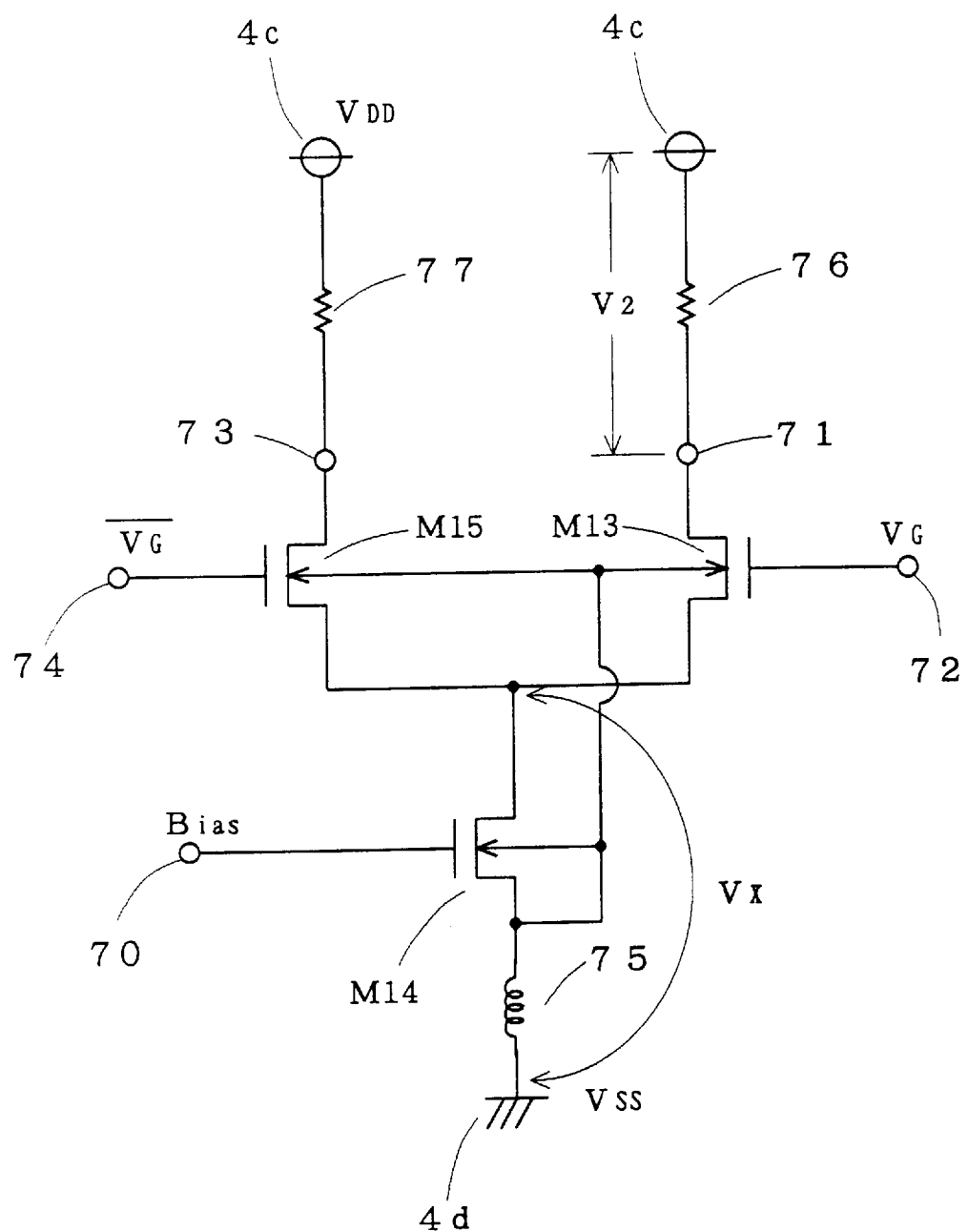
FIG. 15 is a circuit diagram showing conditions for simulation of operation of a conventional current source.
Figure 16:
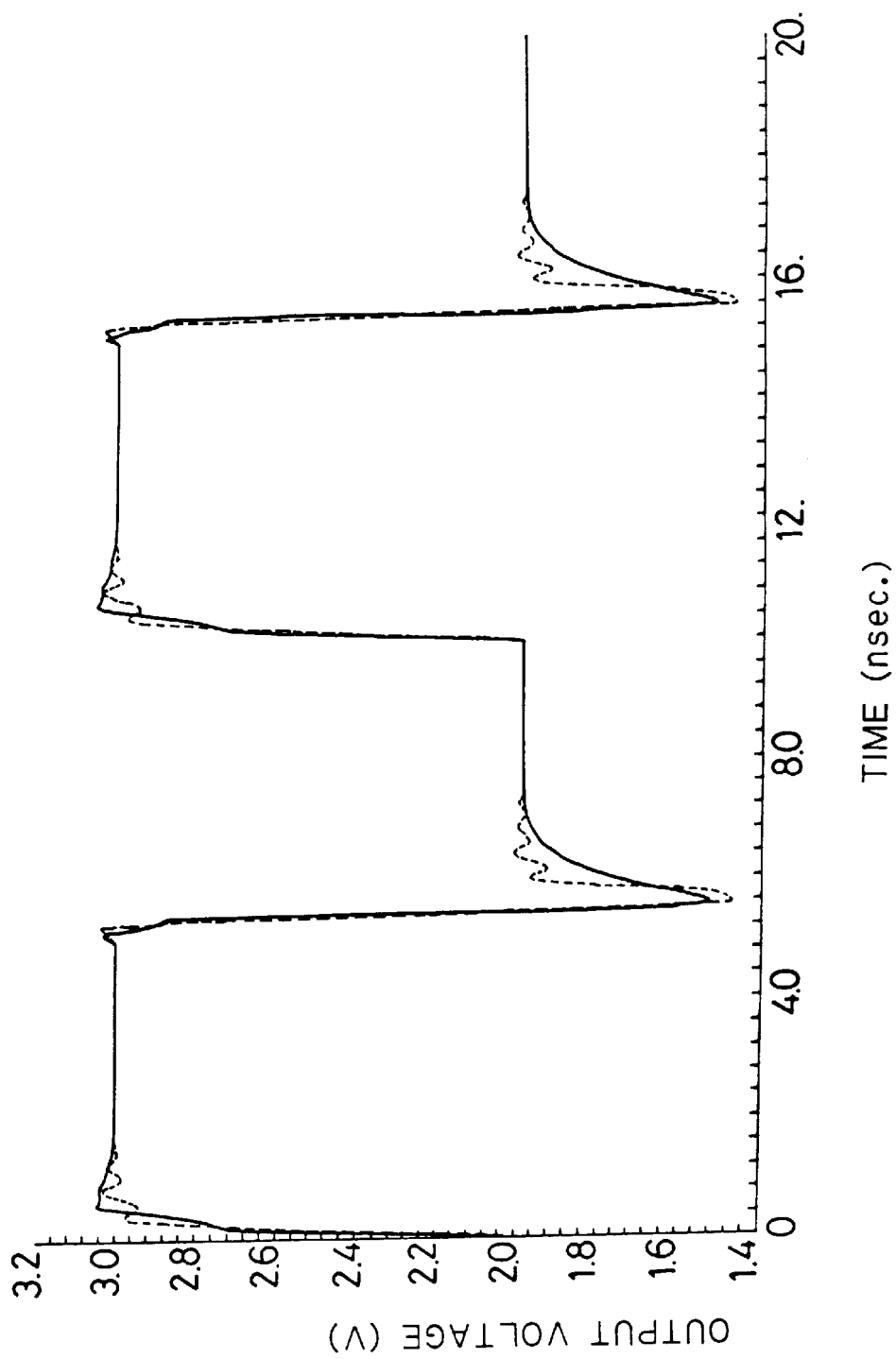
FIG. 16 is a graph showing simulation results of operation of the current source in the fifth preferred embodiment of the invention and the conventional current source.

FIG. 14 and FIG. 15 are circuit diagrams showing conditions of simulation for explaining the effects stated above. FIG. 14 assumes a state in which the current source in the fifth preferred embodiment of the invention is formed in the semiconductor integrated circuit device, where reference numeral 75 denotes an inductance parasitizing the power source line 4d side as seen from the current source, and 76, 77 are load resistances connected between the current output terminals 71, 73 and the power source line 4c, respectively. FIG. 15 assumes a state in which a conventional current source is formed in the semiconductor integrated circuit device, where the same inductance 75 and load resistances 76, 77 as shown in FIG. 14 are connected. FIG. 16 is a graph showing the simulation results of the circuits shown in FIG. 14 and FIG. 15. In FIG. 16, changes of voltages $V_1$ and $V_2$ occurring in the load resistance 76 in FIG. 14 and FIG. 15 are indicated by the solid line and broken line, respectively. The gate of the NMOS transistor M14 used in this simulation is 1 μm in length and 100 μm in width, and the gate of the NMOS transistors M13, M15 are 1 μm in length and 50 μm in width. The resistance value of the load resistances 76, 77 is both 1 kΩ, and the value of the inductance 75 is 10 nH. As known from FIG. 16, the output current is stabler in the current source shown in FIG. 14, and ringing of the voltage $V_1$ occurring at both ends of the load resistance 76 at the time of switching is suppressed.

Explanation is next made into the difference in stability of output current between the current sources in FIG. 14 and FIG. 15. For the sake of simplicity of description, in the current sources shown in FIG. 14 and FIG. 15, it is assumed that the NMOS transistors M13 to M15 are operating in saturated region. Incidentally, since the NMOS transistors M13, M15 perform complementary operations, only the transistor M13 is explained.

When the NMOS transistor M13 shown in FIG. 15 is ON, the drain current $I_{D13}$ flowing in the transistor M13 is given in formula 1.

$$I_{D13} = \frac{\beta_2}{2}(V_{GS} - V_{TH13})^2 \qquad \text{(Formula 1)}$$

$$= \frac{\beta_2}{2}(V_G - V_X - V_{TH13})^2$$

where $V_{TH13}$ is the threshold voltage of transistor M13, $\beta_{13}$ is the gain constant of the transistor M13, $V_{GS}$ is the gate-source voltage of the transistor M13, $V_X$ is the source voltage of the transistor M13, and $V_G$ is the gate voltage of the transistor M13.

The threshold voltage $V_{TH13}$ of the transistor M13 is given in formula 2.

$$V_{TH13} = V_{TO} + \gamma(\sqrt{2\phi_P + V_{SB}} - \sqrt{2\phi_P}) \qquad \text{(Formula 2)}$$

Where $$\gamma = \frac{t_{OX}}{\epsilon_{OX}}\sqrt{2q\epsilon NA}$$

where $V_{TO}$ is the threshold voltage of transistor M13 when the source-back gate voltage $V_{SB}=0$, γ is device parameter, $\phi_P$ is the Fermi level of P-type substrate, $\epsilon_{Ox}$, $t_{Ox}$ are dielectric constant of gate oxide film and thickness of gate oxide film, NA is the impurity concentration of P-type substrate, q is the electric charge of electron, and ε is the dielectric constant of silicon. Herein, the back gate of the NMOS transistor M13 is connected to the power source line 4d, and hence the source-back gage voltage $V_{SB}$ is $V_S - V_B = V_X$, so that formula 2 may be modified as in formula 3. The effect by this threshold voltage $V_{TH13}$ (so-called body effect) is left over. At the same time, the threshold voltage of the transistor M13 increases.

$$V_{TH13} = V_{TO} + \gamma(\sqrt{2\phi_P + V_X} - \sqrt{2\phi_P}) \qquad \text{(Formula 3)}$$

Assuming an inductance is present in the power source line 4d, in the conventional current source shown in FIG. 15, the NMOS transistors M13, M15 induce a large current change momentarily at the time of switching. By this current change, the effect of electromotive force given as Ldi/dt is transmitted to node $V_X$, thereby generating oscillation of output waveform.

On the other hand, in the current source shown in FIG. 14, when the NMOS transistor M13 is ON, same as in the current source shown in FIG. 15, the drain voltage $I_{D13}$ is given in formula 1. The threshold voltage $V_{TH13}$ of the NMOS transistor M13 is also given in formula 2, same as in the current source in FIG. 15. However, since the back gate of the transistor M13 is connected to the source, the source-back gate voltage $V_{SB}$ is $V_S - V_B = 0$, and hence the threshold voltage $V_{TH13}$ is equal to $V_{TO}$. Therefore, the effect of electromotive force Ldi/dt due to parasitic inductance of the power source line 4d is smaller than in the conventional current source shown in FIG. 15.

Sixth Preferred Embodiment

Figure 17:
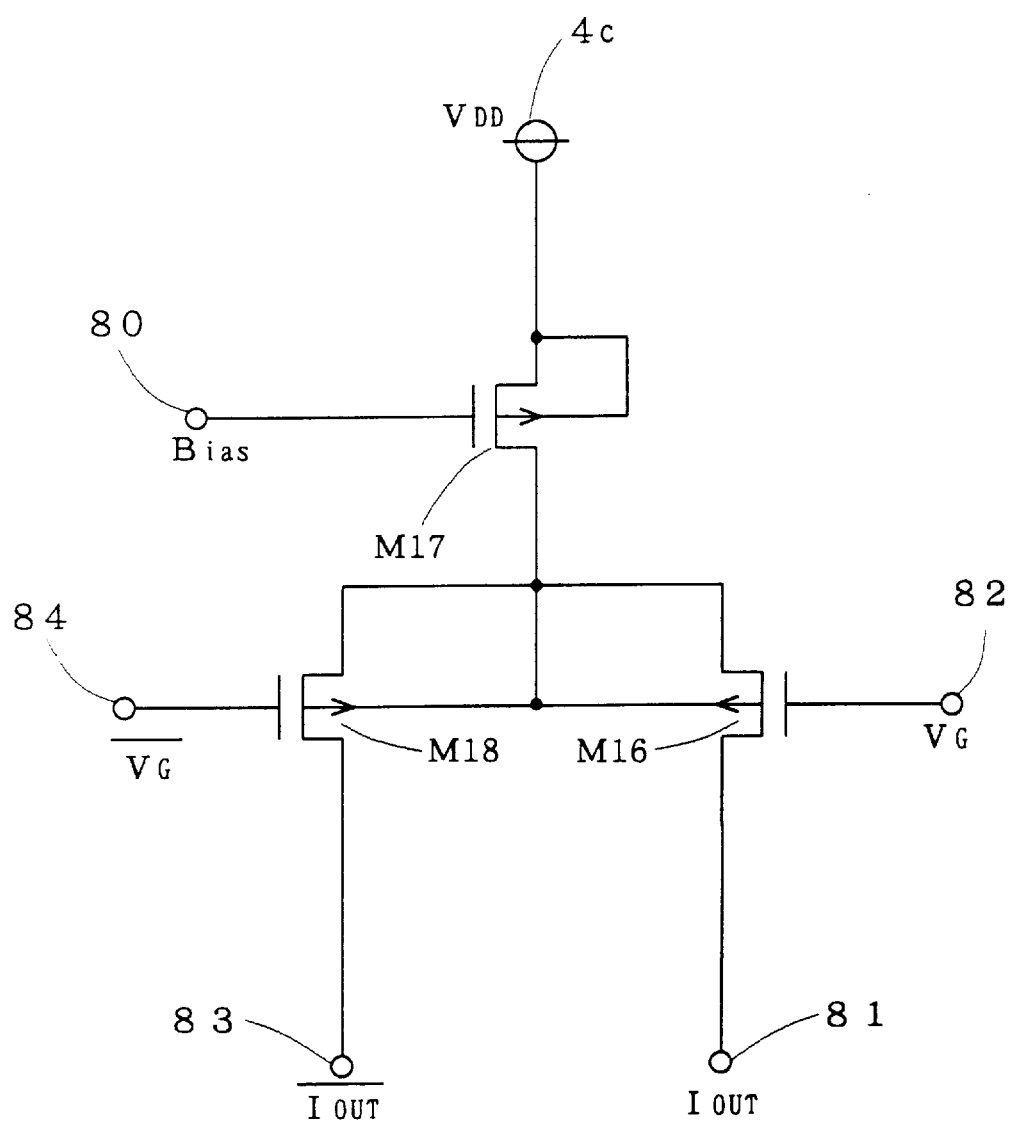
FIG. 17 is a circuit diagram of a current source in a sixth preferred embodiment of the invention.

A sixth preferred embodiment of the invention is described below while referring to FIG. 17 through FIG. 20. FIG. 17 is a circuit diagram showing the construction of a current source provided in the semiconductor integrated circuit device according to the sixth preferred embodiment of the invention. In FIG. 17, reference numeral M16 denotes a PMOS transistor having a gate connected to an input terminal 82, a drain connected to a current output terminal 81, and a mutually connected source and back gate, reference numeral M18 is a PMOS transistor having a gate connected to an input terminal 84, a drain connected to a current output terminal 83, and a source and a gate connected to the source of the PMOS transistor M16, and M17 represents a PMOS transistor having a drain connected to the sources of the PMOS transistors M16, M18, a gate connected to a bias voltage terminal 80, and a source and a back gate connected to the power source line 4c.

Complementary control signals $V_G$ and $\overline{V_G}$ are supplied to the gates of the PMOS transistors M16, M18 from input terminals 82, 84, respectively, and when either one of the PMOS transistors M16, M18 is turned on and the other is turned off, complementary output currents $I_{out}$ and $\overline{I_{out}}$ are supplied.

Figure 27:
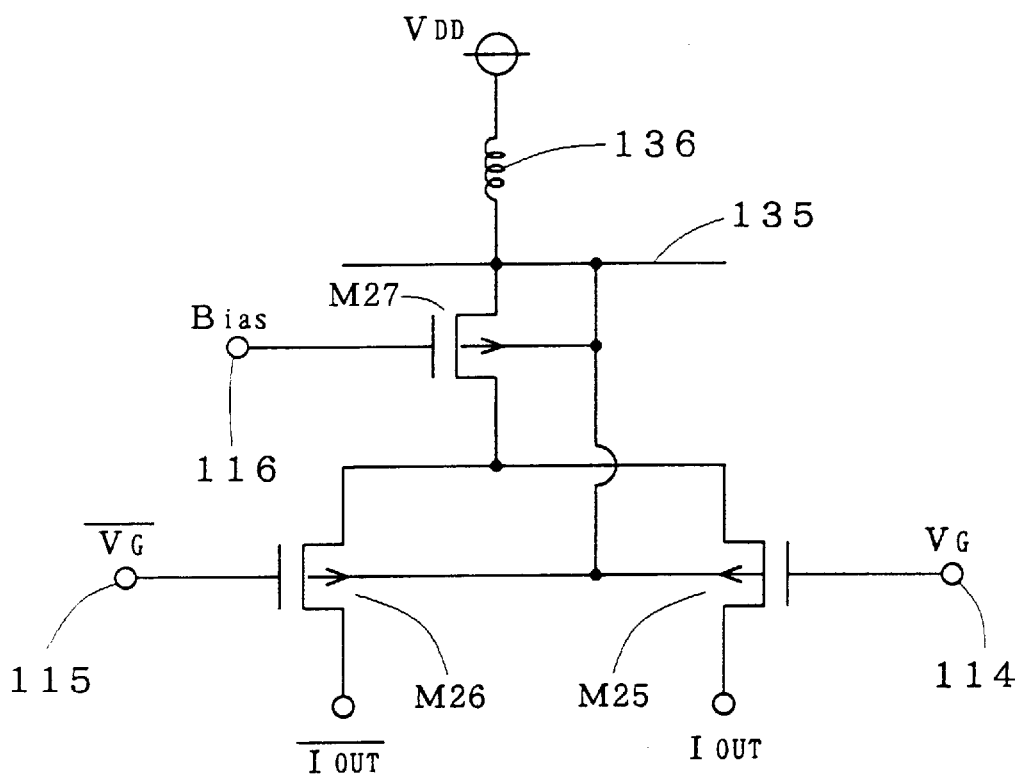
FIG. 27 is a circuit diagram for explaining problems of a conventional current source.

The back gates of the PMOS transistors M16, M18 are connected to the common source of the PMOS transistors M16, M18. Accordingly, as compared with the conventional current source connected to the source of the transistor M27 for supplying a constant current shown in FIG. 27, the output current is stable in the current source shown in FIG. 17.

Figure 18:
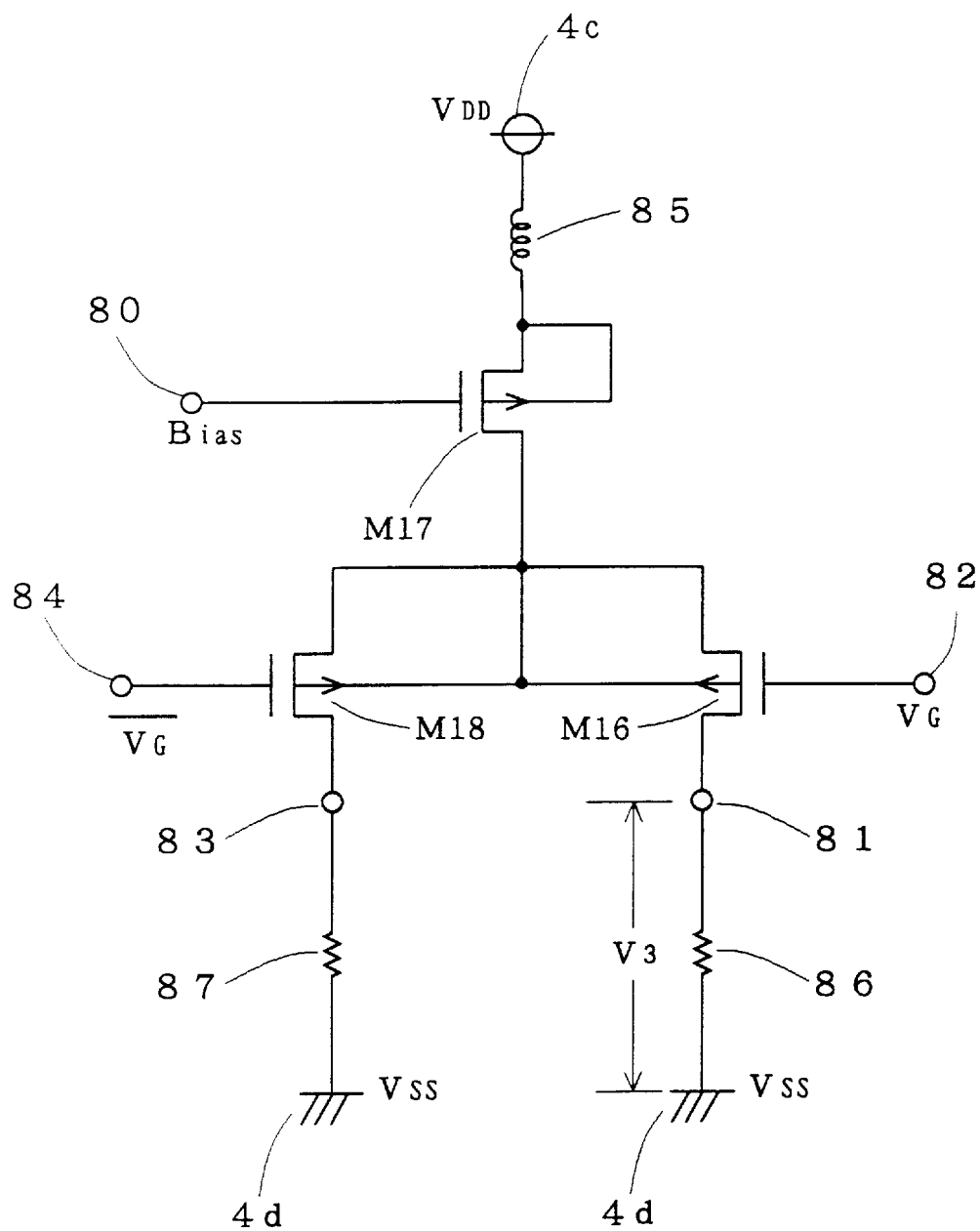
FIG. 18 is a circuit diagram showing conditions for simulation of operation of the current source in the sixth preferred embodiment of the invention.
Figure 19:
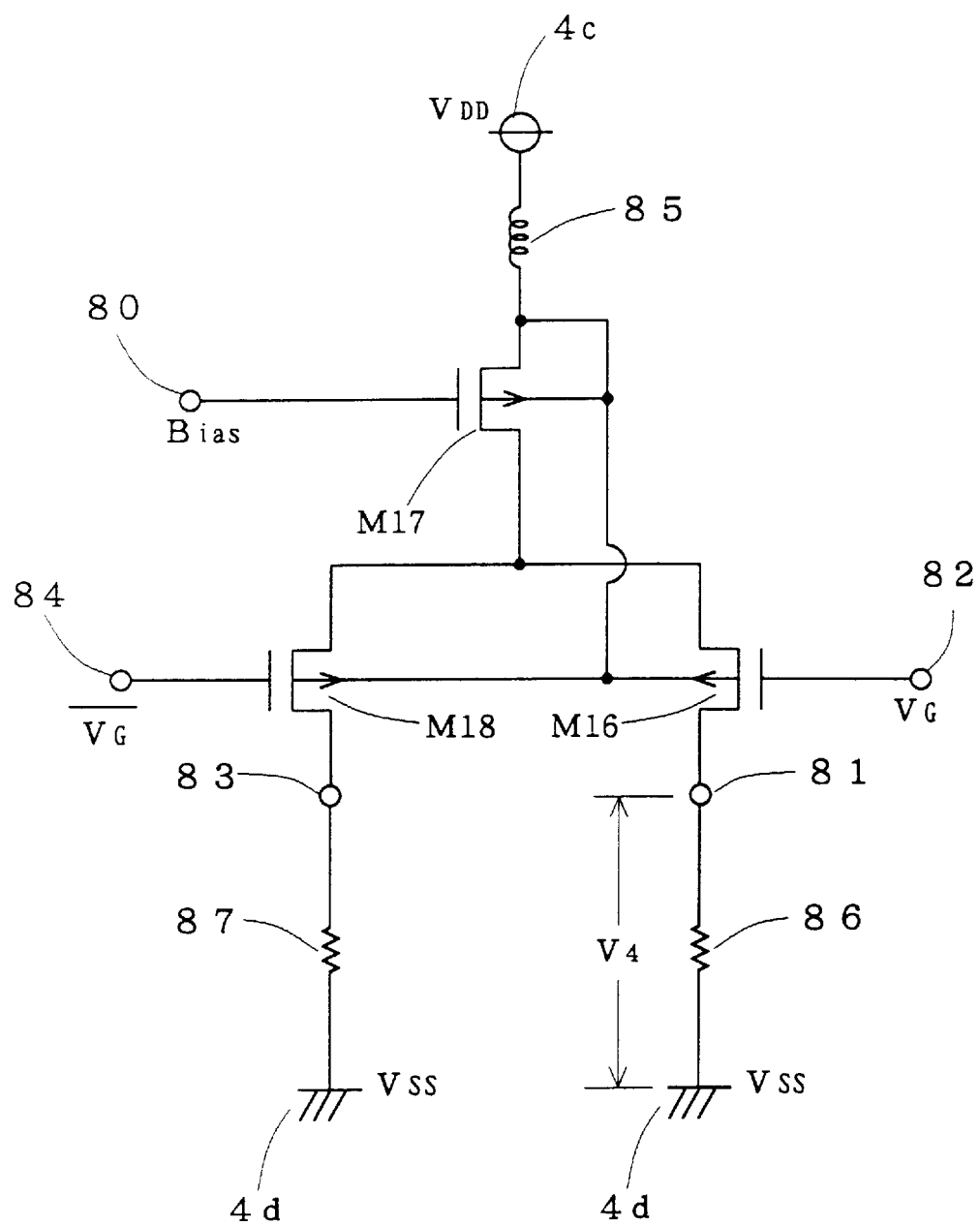
FIG. 19 is a circuit diagram showing conditions for simulation of operation of a conventional current source.
Figure 20:
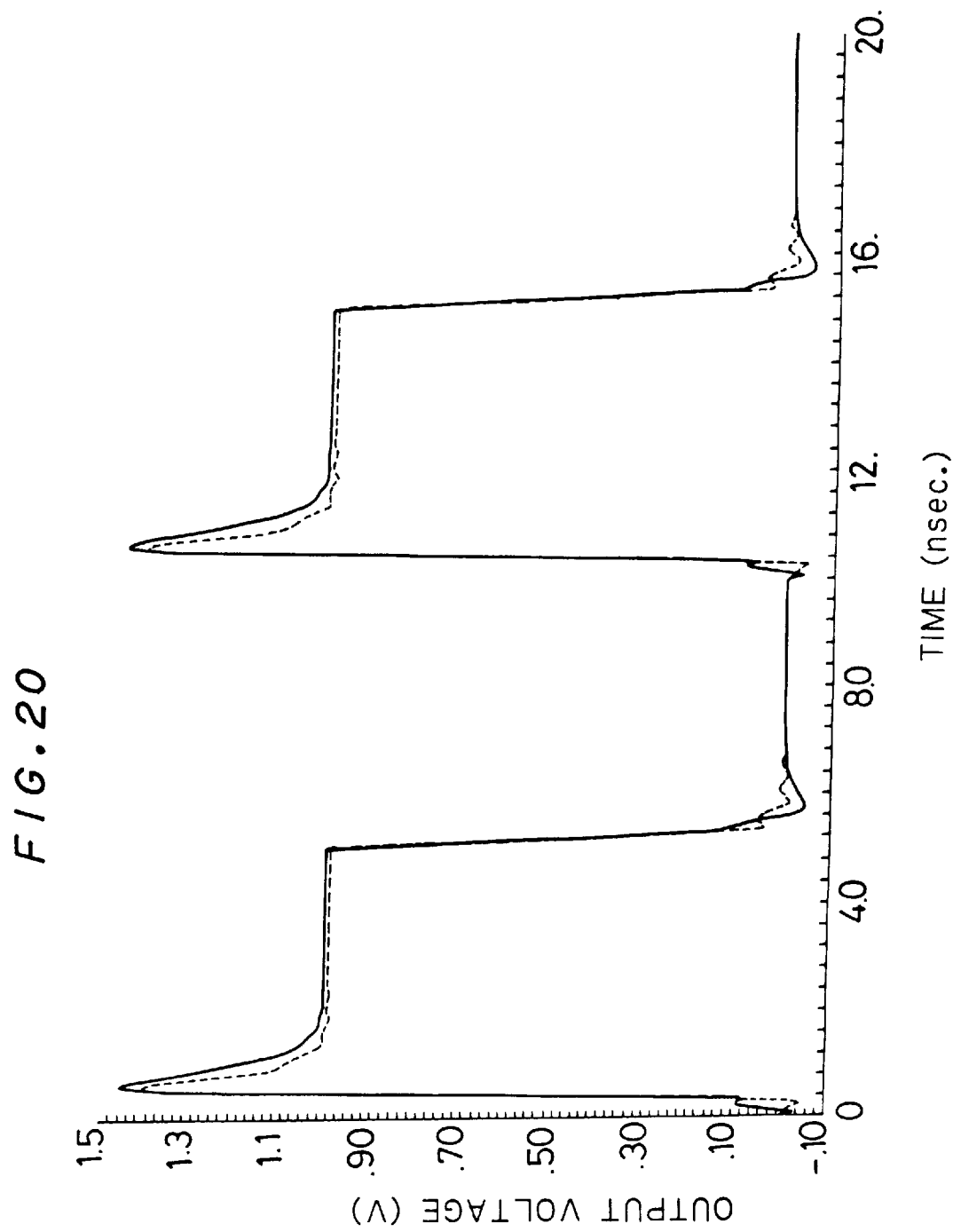
FIG. 20 is a graph showing simulation results of operation of the current source in the sixth preferred embodiment of the invention and the conventional current source.

FIG. 18 and FIG. 19 are circuit diagrams showing conditions of simulation for explaining the effects stated above. FIG. 18 assumes a state in which the current source in the sixth preferred embodiment of the invention is formed in the semiconductor integrated circuit device, where reference numeral 85 denotes an inductance parasitizing the power source line 4c side as seen from the current source, and 86, 87 are load resistances connected between the current output terminals 81, 83 and the power source line 4d, respectively. FIG. 19 assumes a state in which a conventional current source is formed in the semiconductor integrated circuit device, where the same inductance 85 and load resistances 86, 87 as shown in FIG. 18 are connected. FIG. 20 is a graph showing the simulation results of the circuits shown in FIG. 18 and FIG. 19. In FIG. 20, changes of voltages $V_3$ and $V_4$ occurring in the load resistance 86 in FIG. 18 and FIG. 19 are indicated by the solid line and broken line, respectively. The gate of the NMOS transistor M17 used in this simulation is 1 $\mu$m in length and 100 $\mu$m in width, and the gate of the NMOS transistors M16, M18 are 1 $\mu$m in length and 50 $\mu$m in width. The resistance value of the load resistances 86, 87 is both 1 k$\Omega$, and the value of the inductance 85 is 10 nH. As known from FIG. 20, the output current is stabler in the current source shown in FIG. 18, and ringing of the voltage $V_3$ occurring at both ends of the load resistance 86 at the time of switching is suppressed.

In the fifth and sixth preferred embodiments, as the transistor for switching for composing the current source, two NMOS transistors M13, M15, and two PMOS transistors M16, M18 are used, but the number of switching transistors may be one or three or more, and the same effects as in the preferred embodiments are obtained.

In the preferred embodiments, the NMOS transistor or PMOS transistor for switching is turned on and off, but it may be replaced by any other means that causes a sudden change in the current value issued from the current source, and the same effects as in the foregoing preferred embodiments are obtained.

Figure 21:
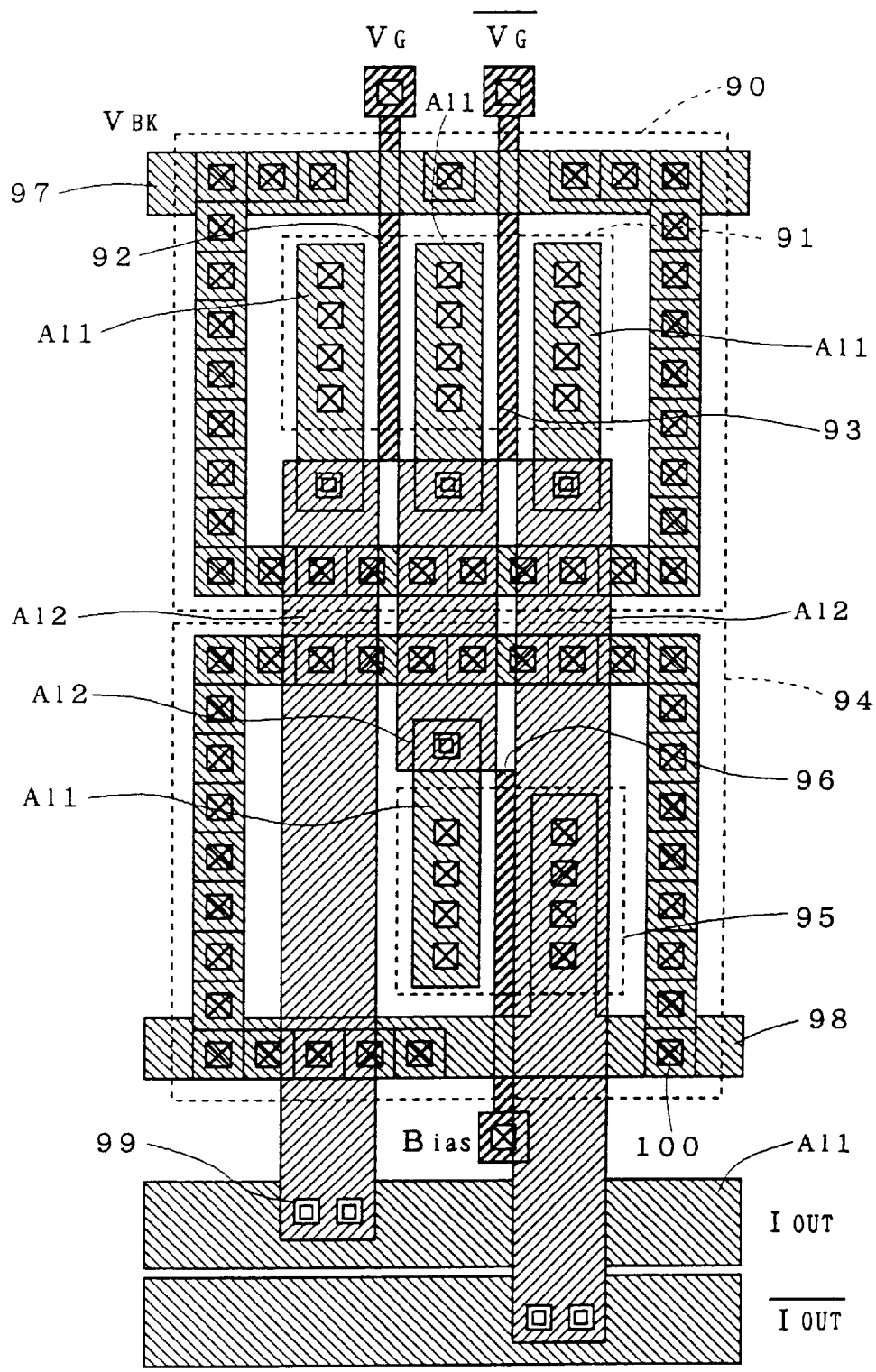
FIG. 21 is a layout diagram of semiconductor integrated circuit device according to the first to fourth preferred embodiments of the invention.
Figure 22:
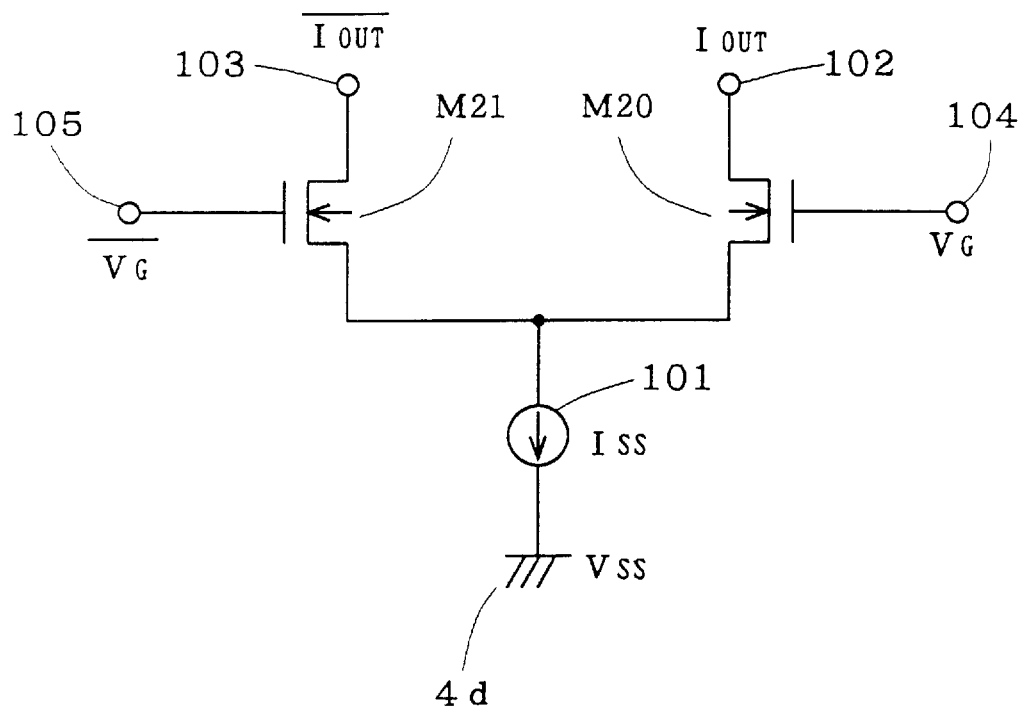
FIG. 22 is a circuit diagram of a conventional current source using NMOS transistor.
Figure 23:
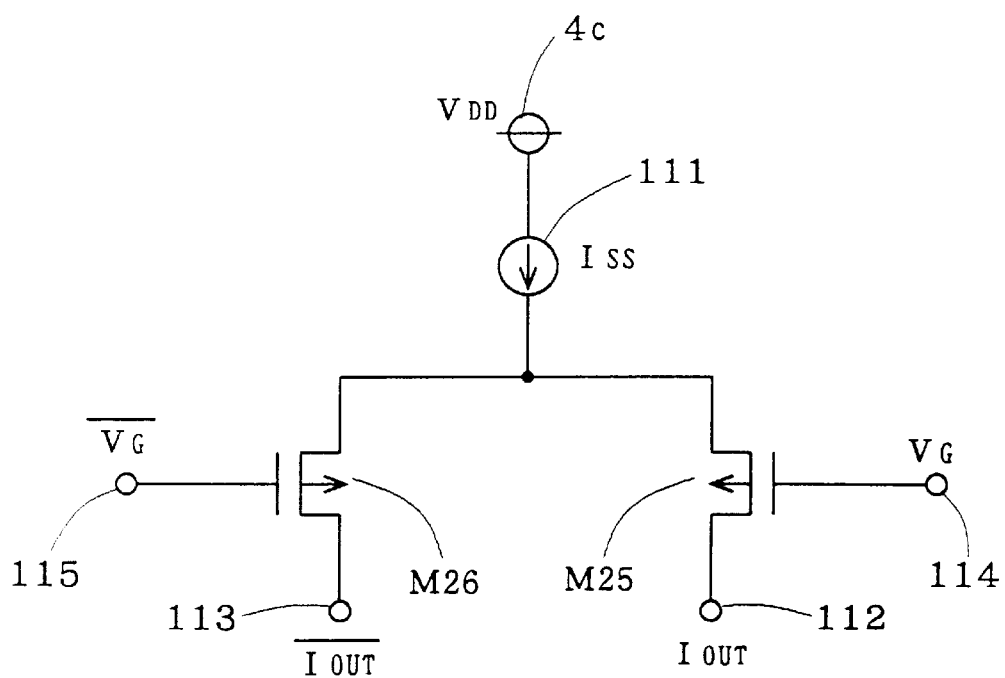
FIG. 23 is a circuit diagram of a conventional current source using PMOS transistor.

An example of layout of the current source described herein is shown in FIG. 21. In FIG. 21, reference numerals 90, 94 are wells for forming a transistor, 91, 95 are diffusion layers formed in the wells 90 and 95, 92 and 93 are polysilicon for composing the gate of MOS transistor for switching, 96 is polysilicon for composing the gate of MOS transistor working as a constant current generator, 97 is a first layer aluminum wiring for applying a back gate potential of MOS transistor for switching, 98 is a first layer aluminum wiring for applying a back gate potential of the MOS transistor for constant current generator, 99 is a through-hole for connecting the first layer aluminum wiring and second layer aluminum wiring, 100 is a contact for connecting the first layer aluminum wiring and semiconductor substrate, A11 is a first layer aluminum wiring, and A12 is a second layer aluminum wiring. In the current source of the semiconductor integrated circuit device of the invention, the back gate of the MOS transistor for switching is cut off from the back gate of the MOS transistor for constant current generator, and is connected to a stable potential $V_{BK}$. Accordingly, in order that the well potential which is the back gate of the MOS transistor for switching may be taken out, the first layer aluminum wiring 97 and the first layer aluminum wiring 98 are provided separately.

While the invention has been shown and described in detail, the foregoing description is in all aspects illustrative and not restrictive. It is therefore understood that numerous modifications and variations can be devised without departing from the scope of the invention.

We claim:

1. A current source for outputting a current signal comprising:

first, second, and third power source lines;

a constant current generator connected between said first and second power source lines; and a first MOS transistor having a gate to which a control signal for turning on and off the first MOS transistor is supplied, a source, a drain and a back gate connected to said third power source line, and said drain connected to an output terminal to output the current signal, wherein said third power source line supplies a voltage from a voltage source only to said back gate of said first MOS transistor;

wherein said constant current generator comprises:

a second MOS transistor having a drain, a source connected to said first power source line, a gate to which a specified bias voltage is applied, and a back gate connected to said first power source line;

said source of said first MOS transistor is connected to said drain of said second MOS transistor; and said second MOS transistor supplies a specified current to an element connected between said drain of said first MOS transistor and said second power source line.

2. A semiconductor integrated circuit device having a current source, which comprises at least one MOS transistor and is composed to vary an output current by turning on and turning off said at least one MOS transistor, comprising:

first, second and third power source lines for receiving respective power source voltages;

wherein said first and second power source lines are connected to said current source for outputting power signals for driving said current source; and wherein said third power source line is connected to said current source and outputs a back gate potential only applied to the back gate potential of said at least one MOS transistor of said current source, and wherein said at least one MOS transistor further includes a drain, and a gate, wherein a control signal is fed to the gate for controlling turning on and turning off the at least one MOS transistor;

wherein said current source further comprises:

a first constant current generator connected to said first and second power lines; and wherein said first constant current generator comprises:

a second MOS transistor having a source connected to said first power source line, a back gate connected to said source, a drain connected to said source of said first MOS transistor, and a gate to which a specified bias voltage is applied.

3. A current source for outputting a current signal comprising:

first, second and third power source lines;

a constant current generator having a first end and a second end connected to said first power source line, and connected between said first and second power source lines; and a first MOS transistor having a gate in which a control signal for controlling turning on and off the first MOS transistor is supplied, a source and a drain connected in series to said constant current generator, and said drain connected to an output terminal to output the current signal, and a back gate connected to said third power source line;

wherein said constant current generator comprises:

a second MOS transistor having a drain, a source connected to said first power source line, a gate to which a specified bias voltage is applied, and a back gate connected to said first power source line;

said source of said first MOS transistor is connected to said drain of said second MOS transistor; and said second MOS transistor supplies a specified current to an element connected between said drain of said first MOS transistor and said second power source line.

4. A semiconductor integrated circuit device having a current source which comprises at least one MOS transistor and is composed to vary an output current value by turning on and turning off of said at least one MOS transistor, comprising:

first, second and third power source lines for receiving respective power source voltages;

wherein said first and second power source lines are connected to said current source for outputting power signals for driving said current source; and wherein said second and third power source lines are connected to said current source and output a back gate potential only applied to the back gate potential of said at least one MOS transistor of said current source;

a first constant current generator connected to said first and second power source lines; and said at least one MOS transistor includes:

a first MOS transistor having a gate in which a control signal for controlling turning on and turning off is fed, a source and a drain, and a back gate connected to said third power source line; and wherein said first constant current generator comprises:

a second MOS transistor having a source connected to said first power source line, a back gate connected to said source, a drain connected to said source of said first MOS transistor, and a gate to which a specified bias voltage is applied.

* * * * *